United States Patent
Zellner et al.

(10) Patent No.: US 9,372,411 B2
(45) Date of Patent: Jun. 21, 2016

(54) PROJECTION OBJECTIVE OF A MICROLITHOGRAPHIC PROJECTION EXPOSURE APPARATUS

(71) Applicant: Carl Zeiss SMT GmbH, Oberkochen (DE)

(72) Inventors: Johannes Zellner, Aalen (DE); Boris Bittner, Roth (DE); Norbert Wabra, Werneck (DE); Martin von Hodenberg, Oberkochen (DE); Sonja Schneider, Oberkochen (DE); Ricarda Schoemer, Zusmarshausen (DE); Arne Schob, Jena (DE); Guenter Rudolph, Jena (DE); Alexander Gratzke, Jena (DE); Bryce Anton Moffat, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 331 days.

(21) Appl. No.: 14/199,932

(22) Filed: Mar. 6, 2014

(65) Prior Publication Data

US 2014/0185024 A1   Jul. 3, 2014

Related U.S. Application Data

(63) Continuation of application No. PCT/EP2011/004859, filed on Sep. 29, 2011.

(51) Int. Cl.
| | |
|---|---|
| *G03B 27/52* | (2006.01) |
| *G03B 27/54* | (2006.01) |
| *G03F 7/20* | (2006.01) |
| *H01S 5/00* | (2006.01) |
| *H01S 5/40* | (2006.01) |

(52) U.S. Cl.
CPC ........ *G03F 7/70308* (2013.01); *G03F 7/70891* (2013.01); *H01S 5/005* (2013.01); *H01S 5/0064* (2013.01); *H01S 5/4025* (2013.01)

(58) Field of Classification Search
CPC ............ G03F 7/70891; G03F 7/70191; G03F 7/70883; G03F 7/70266; G03F 7/70308
USPC ......................................... 355/30, 53, 67–71
See application file for complete search history.

(56) References Cited

U.S. PATENT DOCUMENTS

| | | | |
|---|---|---|---|
| 6,338,823 | B1 | 1/2002 | Furukawa |
| 6,504,597 | B2 | 1/2003 | Schuster et al. |

(Continued)

FOREIGN PATENT DOCUMENTS

| | | |
|---|---|---|
| EP | 823 662 A2 | 2/1998 |
| EP | 1 528 646 | 5/2005 |

(Continued)

OTHER PUBLICATIONS

International Search Report for corresponding PCT Appl No. PCT/EP2011/004859, dated Jul. 31, 2012.

*Primary Examiner* — Hung Henry Nguyen
(74) *Attorney, Agent, or Firm* — Fish & Richardson P.C.

(57) ABSTRACT

A projection objective of a microlithographic projection exposure apparatus includes a wavefront correction device including a refractive optical element that has two opposite optical surfaces, through which projection light passes, and a circumferential rim surface extending between the two optical surfaces. A first and a second optical system are configured to direct first and second heating light to different portions of the rim surface such that at least a portion of the first and second heating light enters the refractive optical element. A temperature distribution caused by a partial absorption of the heating light results in a refractive index distribution inside the refractive optical element that corrects a wavefront error. At least the first optical system includes a focusing optical element that focuses the first heating light in a focal area such that the first heating light emerging from the focal area impinges on the rim surface.

34 Claims, 12 Drawing Sheets

(56) References Cited

U.S. PATENT DOCUMENTS

| | | |
|---|---|---|
| 6,781,668 B2 | 8/2004 | Schuster et al. |
| 7,817,249 B2 | 10/2010 | Uehara |
| 7,830,611 B2 | 11/2010 | Conradi et al. |
| 2005/0018269 A1 | 1/2005 | Weiss et al. |
| 2008/0123066 A1* | 5/2008 | Hendricus Jansen .. G02B 7/028 355/30 |
| 2008/0204682 A1 | 8/2008 | Uehara et al. |
| 2009/0257032 A1 | 10/2009 | Eva et al. |
| 2010/0128367 A1 | 5/2010 | Beckenbach et al. |
| 2010/0201958 A1 | 8/2010 | Hauf et al. |
| 2010/0231883 A1 | 9/2010 | Dodoc et al. |
| 2010/0290020 A1 | 11/2010 | Mori |

FOREIGN PATENT DOCUMENTS

| | | |
|---|---|---|
| WO | WO 2010/034674 | 4/2010 |
| WO | WO 2011/116792 | 9/2011 |

\* cited by examiner

PROJECTION OBJECTIVE OF A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2011/004859, filed Sep. 29, 2011. The entire disclosure of international application PCT/EP2011/004859 is incorporated by reference herein.

BACKGROUND OF THE INVENTION

1. Field of the Invention

The invention generally relates to a projection objective of a microlithographic projection exposure apparatus, and in particular to such an objective containing a wavefront correction device in which heating light distinct from projection light is directed towards a rim surface of a refractive optical element.

2. Description of Related Art

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV), vacuum ultraviolet (VUV) or extreme ultraviolet (EUV) light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system, a mask alignment stage for aligning the mask, a projection objective and a wafer alignment stage for aligning the wafer coated with the photoresist. The illumination system illuminates a field on the mask that may have the shape of a rectangular slit or a narrow ring segment, for example.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or simply scanner, each target portion is irradiated by progressively scanning the mask pattern under the projection light beam in a given reference direction while synchronously scanning the substrate parallel or anti-parallel to this direction. The ratio of the velocity of the wafer and the velocity of the mask is equal to the magnification $\beta$ of the projection lens. A typical value for the magnification is $\beta = \pm \frac{1}{4}$.

It is to be understood that the term "mask" (or reticle) is to be interpreted broadly as a patterning mechanism. Commonly used masks contain transmissive or reflective patterns and may be of the binary, alternating phase-shift, attenuated phase-shift or various hybrid mask type, for example.

One of the essential aims in the development of projection exposure apparatus is to be able to lithographically produce structures with smaller and smaller dimensions on the wafer. Small structures lead to high integration densities, which generally has a favorable effect on the performance of the microstructured components produced with the aid of such apparatus. Furthermore, the more devices can be produced on a single wafer, the higher is the throughput of the apparatus.

The size of the structures which can be generated depends primarily on the resolution of the projection objective being used. Since the resolution of projection objectives is inversely proportional to the wavelength of the projection light, one way of increasing the resolution is to use projection light with shorter and shorter wavelengths. The shortest wavelengths currently used are 248 nm, 193 nm or 157 nm and thus lie in the deep or vacuum ultraviolet spectral range. Also apparatus using EUV light having a wavelength of about 13 nm are meanwhile commercially available. Future apparatus will probably use EUV light having a wavelength as low as 6.9 nm.

Another way of increasing the resolution is based on the idea of introducing an immersion liquid with a high refractive index into an immersion interspace, which remains between a last lens on the image side of the projection objective and the photoresist or another photosensitive surface to be exposed. Projection objectives which are designed for immersed operation, and which are therefore also referred to as immersion objectives, can achieve numerical apertures of more than 1, for example 1.3 or even higher.

The correction of image errors (i.e. aberrations) is becoming increasingly important for projection objectives with very high resolution. Different types of image errors usually require different correction measures.

The correction of rotationally symmetric image errors is comparatively straightforward. An image error is referred to as being rotationally symmetric if the wavefront error in the exit pupil of the projection objective is rotationally symmetric. The term wavefront error refers to the deviation of a wave from the ideal aberration-free wave. Rotationally symmetric image errors can be corrected, for example, at least partially by moving individual optical elements along the optical axis.

Correction of those image errors which are not rotationally symmetric is more difficult. Such image errors occur, for example, because lenses and other optical elements heat up rotationally asymmetrically. One image error of this type is astigmatism.

A major cause for rotationally asymmetric image errors is a rotationally asymmetric, in particular slit-shaped, illumination of the mask, as is typically encountered in projection exposure apparatus of the scanner type. The slit-shaped illuminated field causes a non-uniform heating of those optical elements that are arranged in the vicinity of field planes. This heating results in deformations of the optical elements and, in the case of lenses and other elements of the refractive type, in changes of their refractive index. If the materials of refractive optical elements are repeatedly exposed to the high energetic projection light, also permanent material changes are observed. For example, a compaction of the materials exposed to the projection light sometimes occurs, and this compaction results in local and permanent changes of the refractive index. In the case of mirrors the reflective multi-layer coatings may be damaged by the high local light intensities so that the reflectance is locally altered.

The heat induced deformations, index changes and coating damages alter the optical properties of the optical elements and thus cause image errors. Heat induced image errors sometimes have a twofold symmetry. However, image errors with other symmetries, for example threefold or fivefold, are also frequently observed in projection objectives.

Another major cause for rotationally asymmetric image errors are certain asymmetric illumination settings in which the pupil plane of the illumination system is illuminated in a rotationally asymmetric manner. Important examples for such settings are dipole settings in which only two poles are illuminated in the pupil plane. With such a dipole setting, also the pupil planes in the projection objective contain two strongly illuminated regions. Consequently, lenses or mirrors arranged in or in the vicinity of such an objective pupil plane are exposed to a rotationally asymmetric intensity distribution which gives rise to rotationally asymmetric image errors. Also quadrupole settings often produce rotationally asymmetric image errors, although to a lesser extent than dipole settings.

In order to correct rotationally asymmetric image errors, U.S. Pat. No. 6,338,823 B1 proposes a lens which can be selectively deformed with the aid of a plurality of actuators distributed along the circumference of the lens. The deformation of the lens is determined such that heat induced image errors are at least partially corrected. A more complex type of such a correction device is disclosed in US 2010/0128367 A1.

U.S. Pat. No. 7,830,611 B2 discloses a similar correction device. In this device one surface of a deformable plate contacts an index matched liquid. If the plate is deformed, the deformation of the surface adjacent the liquid has virtually no optical effect. Thus this device makes it possible to obtain correcting contributions from the deformation not of two, but of only one optical surface. A partial compensation of the correction effect, as it is observed if two surfaces are deformed simultaneously, is thus prevented.

However, the deformation of optical elements with the help of actuators has also some drawbacks. If the actuators are arranged at the circumference of a plate or a lens, it is possible to produce only a restricted variety of deformations with the help of the actuators. This is due to the fact that both the number and also the arrangement of the actuators are fixed. In particular it is usually difficult or even impossible to produce deformations which may be described by higher order Zernike polynomials, such as $Z_{10}$, $Z_{36}$, $Z_{40}$ or $Z_{64}$. The aforementioned U.S. Pat. No. 7,830,611 B2 also proposes to apply transparent actuators directly on the optical surface of an optical element. However, it is difficult to keep scattering losses produced by the transparent actuators low.

US 2010/0201958 A1 and US 2009/0257032 A1 disclose a correction device that also comprises two transparent optical elements that are separated from each other by a liquid layer. However, in contrast to the device described in the aforementioned U.S. Pat. No. 7,830,611 B2, a wavefront correction of light propagating through the optical elements is not produced by deforming the optical elements, but by changing their refractive index locally. To this end one optical element may be provided with heating stripes that extend over the entire surface. The liquid ensures that the average temperatures of the optical elements are kept constant. Although even higher order wavefront errors can be corrected very well, this device has a complex structure and is therefore expensive.

Unpublished international patent application PCT/EP2010/001900 discloses a correction device in which a plurality of fluid flows emerging from outlet apertures enter a space through which projection light propagates during operation of the projection exposure apparatus. A temperature controller sets the temperature of the fluid flows individually for each fluid flow. The temperature distribution is determined such that optical path length differences caused by the temperature distribution correct wavefront errors.

Another, and sometimes simpler, approach to deal with heat induced image errors is not to correct errors that have been produced in a plurality of optical elements, but to avoid that such errors occur altogether. This usually involves the locally selective heating or cooling of optical elements so that their temperature distribution becomes at least substantially symmetrical. Any residual heat induced image error of the rotationally symmetric type may then be corrected by more straightforward measures, for example by displacing optical elements along the optical axis.

The additional heating or cooling of optical elements may be accomplished by directing a hot or cool gas towards the element, as it is known from U.S. Pat. No. 6,781,668 B2, for example. However, it is difficult to accurately control the temperature distribution of the optical element with gas flows.

Therefore it has been proposed to direct light beams onto selected portions of optical elements so as to achieve an at least substantially rotationally symmetric temperature distribution on or in the optical element. Usually the light beam is produced by a separate light source which emits radiation having a wavelength that is different from the wavelength of the projection light. The wavelength of this additional light source is determined such that the correction light does not contribute to the exposure of the photoresist, but is still at least partially absorbed by the optical elements or a layer applied thereon.

EP 823 662 A2 describes a correction system of this type in which two additional light sources are provided that illuminate the portions of the mask which surround the (usually slit-formed) field that is illuminated by the projection light. Thus all optical elements in the vicinity of field planes are subjected to three different light beams that heat up the optical element almost in a rotationally symmetrical manner. In other embodiments additional correction light is coupled into the illumination system of the projection exposure apparatus in or in close proximity to a pupil plane. Since, depending on the illumination setting, the center of the pupil plane is often not illuminated during the projection operation, light coupled into this center contributes to a more homogeneous illumination of optical elements that are arranged in or in proximity to a pupil plane in the projection objective.

U.S. Pat. No. 7,817,249 B2 discloses a device which directs heating light simultaneously on selected portions of two opposite lens surfaces. In one embodiment heating light produced by a heating light source is distributed by a spatial light modulator among eight optical fibers. Focusing optics associated with each optical fiber direct the heating light emitted by the optical fibers towards the selected portions of the lens surfaces.

US 2005/0018269 A1 describes a similar correction device which makes it possible to heat up certain portions of selected optical elements using a light ray that scans over the portions to be heated up. This device can also be arranged within the projection objective and makes it possible to increase the temperature very selectively so that an almost perfectly rotationally symmetric temperature distribution can be achieved.

If the correction device is arranged inside the projection objective, access to its optical elements is often restricted, and even if it is possible to direct heating light on all points on an optical element, the heating light often impinges on the optical surface at very large angles of incidence. As a result, a substantial fraction of the light energy is reflected at the surface and cannot contribute to the heating up of the elements.

In one embodiment described in the aforementioned US 2005/0018269 A1 this problem is solved in that the correction light passes through a plurality of optical elements without being subject to substantial absorption before the correction light impinges on the optical element which shall be heated up. This can be achieved by selecting materials for the optical elements which have a different coefficient of absorption for the correction light on the one hand and the projection light on the other hand. However, it is still difficult to reach all points of interest on an optical surface with a scanning light ray that passes through a plurality of other lenses before it impinges on the optical surface.

US 2010/0231883 A1 overcomes this problem by providing a correction device that includes a secondary illumination system which produces an intensity distribution of correaction light in a reference surface. This reference surface is imaged, using at least a portion of the projection objective, on a plane in which a refractive optical element is arranged. All lenses through which both the correction light and the projection light pass are made of a lens material which has a lower coefficient of absorption for the correction light than the material of the refractive optical element.

U.S. Pat. No. 6,504,597 B2 proposes a correction device in which heating light is coupled into a selected optical element via its peripheral rim surface, i.e. circumferentially. Optical fibers may be used to direct the heating light produced by a single light source to the various locations distributed along the periphery of the optical element. It is also mentioned that this device may not only be used to homogenize the temperature distribution of the optical element, but also to correct wavefront errors caused in other optical elements. Although this device makes it possible to heat up also optical elements that are very densely stacked, it is only capable to produce comparatively coarse temperature distributions. More complex temperature distributions cannot be attained because only very few and strongly divergent heating light beams can be coupled into the optical element.

SUMMARY OF THE INVENTION

There is thus a need for a correction device that is capable to correct also higher order wavefront error, but nevertheless has a simple construction. Furthermore, scattering and other problems associated with elements being arranged in areas through which the projection light passes (e.g. channels for liquids, electrical wiring or actuators), shall be avoided.

In accordance with the present invention this problem is achieved by a projection objective of a microlithographic projection exposure apparatus, wherein the projection objective is configured to image a mask on the light sensitive surface using projection light. The projection objective comprises a wavefront correction device which includes a refractive optical element that has two opposite optical surfaces, through which projection light passes when the mask is imaged on the light sensitive surface. The refractive optical element also has a circumferential rim surface extending between the two optical surfaces. The correction device further comprises a first optical system that is configured to direct first heating light to a first portion of the rim surface such that at least a portion of the first heating light enters the refractive optical element, and a second optical system that is configured to direct second heating light to a second portion of the rim surface, which is distinct from the first portion, such that at least a portion of the second heating light enters the refractive optical element. A temperature distribution caused by a partial absorption of the first and the second heating light results in a refractive index distribution inside the refractive optical element that changes, and in particular corrects, a wavefront error. At least the first optical system comprises a focusing optical element that is configured to focus the first heating light in a focal area such that the first heating light emerging from the focal area impinges on the first portion of the rim surface.

Since the invention uses heating light and not electrical wires or liquids to produce a temperature distribution inside a refractive optical element, the latter is kept free of any elements that could disturb the propagation of projection light through the refractive optical element. Since the heating light is coupled into the refractive optical element via its circumferential rim surface, it is possible to achieve small angles of incidence and to apply special anti-reflective coatings at the rim surface so that a major portion of the heating light is capable of entering the refractive optical element.

In order to be able to produce also complicated refractive index distributions, it is necessary to provide a large number of heating light beams whose intensity (at least in the time average) can be individually adjusted. The larger the number of individual heating light beams is, the more likely it is that heating light internally reflected or scattered in the refractive optical element may find its way back to a light source. However, the operation and stability of many suitable types of light sources, for example lasers, laser diodes or LEDs, is significantly compromised if the emitted light is reflected back into the light source. This may even lead to damages or its complete failure.

In order to prevent that a significant fraction of the emitted heating light is reflected into the light source, the correction device in accordance with the present invention provides a focusing optical element so that the heating light entering the refractive optical element emerges from a focal area. This ensures that only light that passes through the focal area is allowed to get back to the light source. Since heating light scattered or internally reflected is usually not able to leave the refractive optical element such that it passes through the focal area, the light source is very effectively protected from reflected heating light.

The provision of a focal area effectively results in point or line light sources having well defined optical properties. These effective light sources can be arranged very closely to the refractive optical element so that the required volume for the correction device and the projection objective can be kept small. Furthermore, heating light emerging from such a point or line source produces a fan of heating light beams. If two, three or a few more such fans overlap in the refractive optical element, a very good coverage of a central portion of the refractive optical element with heating light beams can be achieved.

A good coverage is also achieved if the originally diverging fan is collimated by a cylindrical rim surface, or more generally if at least the first portion of the rim surface is convex in a plane which is perpendicular to an optical axis of the projection objective at a position, where the refractive optical element is arranged. It may even be achieved that at least the first heating light, after it has entered the refractive optical element, propagates through the refractive optical element as collimated light. This is often advantageous because it ensures a homogenous coverage of heating light beams in a central portion of the refractive optical element.

The protection of the light source against reflected or scattered heating light can be further improved if at least the first optical system comprises a blind having an aperture in which the focal area is positioned. Then it is not the focusing element (or strictly speaking its rim or mount) which obstructs reflected or scattered heating light, but the blind.

At least the first portion of the rim surface where the first heating light enters may be curved in a plane intersecting this portion and containing an optical axis of the projection objective at a position, where the refractive optical element is arranged. Then the rim surface has optical power in that plane which may be used, for example, to collimate heating light in that plane. In particular the rim surface may comprise a toroidal surface; in that case the refractive optical element may, for example, have the shape of a barrel. The rim surface may also be constituted from a plurality of planar surfaces that result in a rectangular or polygonal cross section of the refractive optical element.

The optical surfaces of the refractive optical element may be plane and parallel to each other. In that case the refractive optical element is a plate If the refractive optical element has one or two curved optical surfaces, it has an optical power also for the projection light.

The correction device may comprise a light source, which is configured to emit heating light, and a beam splitter which splits the heating light emitted by the light source into the first heating light and the second heating light. In other words, a single light source is used to supply heating light to more than one optical systems that are used to direct heating light towards the rim surface of the refractive optical element. A laser may be used as light source in such embodiments.

It is also envisaged to provide individual light sources for the first, the second and any further optical system. Then the first optical system comprises a single first light source, which is configured to produce the first heating light, and the second optical system comprises a single second light source, which is configured to produce the second heating light.

Irrespective whether the optical systems have their own light source or share a common light source, it is advantageous if at least the first optical system comprises a spatial light modulator that is configured to change (preferably continuously) the intensity of the first heating light in a spatially resolved manner so as to produce a plurality of first heating light beams whose intensity can be changed individually by the spatial light modulator. By splitting up the first heating light into a plurality of first heating light beams it is possible to produce not only a number of light beams that equals the number of optical systems, but to multiply this number considerably. For example, if the spatial light modulator produces 10 or 100 or even 1000 individual heating light beams, a correction device comprising three optical systems may produce 30, 300 or 3000, respectively, individual heating light beams which pass through the refractive optical element along various directions. Then also very complicated refractive index distributions can be produced.

In one embodiment the spatial light modulator comprises an array of beam deviating elements, wherein each beam deviating element is configured to deflect impinging first heating light by a deflection angle that is variable in response to a control signal. Such beam deviating elements may be formed by tiltable micromirrors or by transmissive elements exploiting the opto-acoustic effect.

In another embodiment the spatial light modulator comprises a variable blind having a plurality of apertures whose size and/or transmissivity can be changed individually in response to a control signal.

In a still further embodiment the spatial light modulator comprises a reflective surface and a driver which is configured to change the spatial orientation of the reflective surface. In that case the plurality of first heating light beams is not produced simultaneously, but successively in a kind of scanning arrangement.

Instead of providing a single light source and a spatial light modulator, it is also possible to have a first optical system comprising a plurality of first light sources, wherein each first light source is configured to produce a first heating light beam.

At least one first light source may be an LED having an intensity that can be varied individually.

At least one first light source may be a laser diode. Then the first optical system may comprise a light modulator that is configured to change the intensity of the first heating light beam emitted by the first light source individually.

At least the first optical system may comprise a reflective surface that reflects first heating light after it has traversed the reflective optical element. The reflective surface may be formed by a multi-layer coating applied to the rim surface, a multi-layer coating applied to a substrate that is arranged at a distance from the refractive optical element, or by a surface of a prism. By directing heating light back to the refractive optical element it is possible to reduce the light losses and thus to increase the efficiency of the device.

In order to avoid that heating light reflected at the reflective surface gets back to the light source, the reflective surface may be arranged such that the direction of reflected light differs from the direction of impinging light. This may be achieved, for example, by using a curved reflective surface or a planar surface which is slightly tilted so that the heating light does not impinge perpendicularly on the planar reflective surface.

The direction of reflected light may differ from the direction of impinging light by a very small angle, for example an angle between 0.05° and 5°.

The first optical system may comprise a beam deviating element that is configured to deflect the first heating light such that the focusing optical element is arranged completely above or completely below the rim surface of the refractive optical element. This may imply that a plane, in which the heating light propagates when it enters the light deviating element, is parallel to a plane in which it propagates through the refractive optical element. For example, the beam deviating element may be formed by a prism having an inclined surface which forms an angle of 45° with respect to the optical axis. If the rim surface of the refractive optical element is conical with a cone angle of 45°, the propagation path of the heating light may be folded twice by 90° using total internal reflection so that an axial displacement of the propagation path is achieved.

The focusing element and the refractive optical element may both have the optical effect of positive lenses, and in particular of cylindrical lenses, in a plane which is perpendicular to an optical axis of the projection objective at a position, where the refractive optical element is arranged. The refractive optical element is thus part of two optical systems, namely the projection objective through which projection light passes, and of the correction device through which heating light passes.

In that case the volume of the focusing element may be much smaller, for example at least 100 times, preferably at least 300 times, smaller than the volume of the refractive optical element.

The first heating light may propagate in a first plane and the second heating light may propagate in a second plane, wherein the first plane and the second plane may be either identical or parallel to each other. Other arrangements of these planes are also possible, for example tilted arrangements in which the planes may intersect or not.

Depending on whether the focusing optical element has a focusing power in only one or in two orthogonal directions, the focal area will be a focal point or a focal line, respectively.

If the focusing element has a focusing power only along one direction, it may be formed by a cylindrical lens or a cylindrical mirror.

Generally the first heating light and the second heating light should be more strongly absorbed in the refractive optical element than the projection light. Only then a substantial amount of energy will be absorbed within the refractive optical element so as to achieve the desired temperature distribution.

For example, the first heating light and the second heating light may have a center wavelength between 0.7 µm and 3 µm and the projection light may have the center wavelength between 150 nm and 500 nm. If optical glasses containing a substantial amount of OH molecules are used for the refractive optical element, such first and second heating light will be absorbed much more strongly than the projection light. This particularly applies if the first heating light and the second heating light have a center wavelength between 1.3 µm and 1.5 µm or between 2.0 µm and 2.3 µm or between 2.6 µm and 2.8 µm. In that case the refractive optical element may comprise an optical glass that contains OH molecules with a concentration between 50 ppm and 500 ppm, and preferably between 90 ppm and 150 ppm.

The local density of OH molecules is directly correlated with the refractive index of the optical glass for the projection light, in particular for light having a wavelength of 193 nm or 248 nm. If the density of OH molecules is not sufficiently homogeneous, its fluctuations may be taken into account when the intensities of the first and second heating light are determined.

Generally the first heating light and the second heating light may have a different center wavelength, but often it will be preferred to use first and second heating light having the same center wavelength.

The refractive index distribution produced inside the refractive optical element by partial absorption of the first and the second heating light will generally be determined such that a wavefront error is at least partially correct. A correction of a wavefront error usually implies that the round square means (RSM) of Zernike coefficients used to describe the wavefront errors is reduced. In some cases, however, it may be more prudent not to reduce the RSM, but to change the wavefront error such that it can be more easily corrected by other manipulators or correction mechanisms provided in the projection objective. Such a change of the wavefront error may sometimes result in an even greater RSM, but to the avail of being able to reducing it much further by other mechanisms. For example, a highly asymmetric wavefront error resulting in a small RMS may be transformed into a rotationally symmetric wavefront error which results in a greater RMS, but can be corrected easily by other manipulators.

In one embodiment the first optical system comprises first light detectors that are configured to measure irradiance variations of the first heating light beams after they have left the refractive optical element. Similarly, the second optical system comprises second light detectors that are configured to measure irradiance variations of the second heating light beams after they have left the refractive optical element. This makes it possible to monitor the proper function of light sources that produce the first and second heating light beams.

In that case the projection objective may also comprise a control unit which is configured to control the first optical system and the second optical system depending on the irradiance variations measured by the first and second detectors. This makes it possible to produce more accurately a desired temperature distribution inside the refractive optical element.

In another embodiment at least the first optical system comprises an optical fiber that is configured to guide the first heating light from a first light source, which is arranged outside the projection objective, to the focusing optical element. Such an arrangement of the first light source outside the projection objective is advantageous because it is then possible to replace a defect light source without a need to dismount the projection objective.

In still another embodiment the correction device projection objective comprises a cooling system which is configured to actively cool the refractive optical element. This makes it possible to maintain a neutral heat balance and to quickly change the temperature distribution inside the refractive optical element.

Subject of the present invention is also a projection objective of a microlithographic projection exposure apparatus, wherein the projection objective is configured to image a mask on a light sensitive surface using projection light. The projection objective comprises a wavefront correction device comprising a refractive optical element that has two opposite optical surfaces, through which projection light passes when the mask is imaged on the light sensitive surface. A circumferential rim surface extends between the two optical surfaces. The wavefront correction device further comprises a light source which is configured to emit heating light such that it impinges on the rim surface. A volume confined by the refractive optical element and the light source is filled by an optical medium that is a liquid, a solid or a mixture of a liquid and a solid such as a gel or a paste. Preferably the optical medium has a similar refractive index as the refractive optical element. In particular, the refractive index ratio of the optical medium and the refractive optical element may be at 22° C. between 0.80 and 1.1.

By using such an optical medium, which may be formed by an optical adhesive, for example, refraction at the rim surface is suppressed or at least significantly reduced. This simplifies the coupling of heating light into the refractive optical element, particularly if the rim surface is cylindrical. For example, a straight bar containing a plurality of LEDs or laser diodes may then emit parallel heating light beams, and the collimated nature of these heating light beams is maintained after the heating light has entered the refractive optical element.

Subject of the present invention is also a projection objective of a microlithographic projection exposure apparatus, wherein the projection objective is configured to image a mask on a light sensitive surface using projection light. The projection objective comprises a wavefront correction device comprising a refractive optical element that has two opposite optical surfaces, through which projection light passes when the mask is imaged on the light sensitive surface. A circumferential rim surface extends between the two optical surfaces. The wavefront correction device further comprises a light source which is configured to emit heating light such that it impinges on the rim surface. A portion of the rim surface, at which the heating light impinges, is formed as a Fresnel lens having a refractive power at least along one direction.

Also this measure simplifies the coupling of heating light into the refractive optical element. In contrast to conventional lenses formed directly on the rim surface, a Fresnel lens makes it possible to achieve significantly stronger optical power.

Subject of the present invention is also a projection objective of a microlithographic projection exposure apparatus, wherein the projection objective is configured to image a mask on a light sensitive surface using projection light. The projection objective comprises a wavefront correction device comprising a refractive optical element that has two opposite optical surfaces, through which projection light passes when the mask is imaged on the light sensitive surface. A circumferential rim surface extends between the two optical surfaces. The wavefront correction device further comprises a light source which is configured to emit heating light such that it impinges on the rim surface. The refractive optical element has a bore, a hole or a recess in which the light source is arranged such that the heating light enters the refractive optical element perpendicularly.

This approach ensures that minimum light losses occur at the rim surface, and even the application of an anti-reflection coating may be dispensed with. It also makes it possible to use a light source which is configured to emit heating light beams over an angular range of at least 40°.

Subject of the present invention is also a projection objective of a microlithographic projection exposure apparatus, wherein the projection objective is configured to image a mask on a light sensitive surface using projection light. The projection objective comprises a wavefront correction device comprising a refractive optical element that has two opposite optical surfaces, through which projection light passes when the mask is imaged on the light sensitive surface. A circumferential rim surface extends between the two optical surfaces. The wavefront correction device further comprises a light source which is configured to emit heating light such that it impinges on the rim surface. The correction device further comprises a spatial light modulator that is configured to direct the heating light produced by the light source towards different portions of the rim surface.

The provision of a spatial light modulator makes it possible to dispense with providing a very large number of individual light sources such as LEDs or laser diodes. Instead, only one or very few stronger light sources are used, and the heating light is then split into the individual heating light beams with the help of the spatial light modulator. This encompasses cases in which the various heating light beams are not simultaneously produced by the spatial light modulator, but successively, for example using a scanning set-up. In that case the spatial light modulator may comprise a reflective surface and a driver which is configured to change the spatial orientation of the reflective surface.

Subject of the present invention is also a projection objective of a microlithographic projection exposure apparatus, wherein the projection objective is configured to image a mask on a light sensitive surface using projection light. The projection objective comprises a wavefront correction device comprising a refractive optical element that has two opposite optical surfaces, through which projection light passes when the mask is imaged on the light sensitive surface. A circumferential rim surface extends between the two optical surfaces. The wavefront correction device further comprises a light source which is configured to emit heating light such that it impinges on the rim surface. A reflective surface reflects at least 70% of heating light, which has traversed the refractive optical element, so that it traverses the reflective optical element again.

In this way more heating light will be absorbed by the refractive optical element, and thus the efficiency of the wavefront correction device is increased.

The reflective surface may formed as a reflective coating on the rim surface, or it may be arranged outside the refractive optical element.

DEFINITIONS

The term "light" denotes any electromagnetic radiation, in particular visible light, UV, DUV and VUV light.

The term "light ray" is used herein to denote light whose path of propagation can be described by a line.

The term "light beam" is used herein to denote a plurality of substantially collimated light rays. A light beam usually has a substantially continuous intensity profile across its diameter.

The term "surface" is used herein to denote any planar or curved surface in the threedimensional space. The surface may be part of a body or may be completely separated therefrom.

The term "optically conjugate" is used herein to denote the imaging relationship between two points or two surfaces. Imaging relationship means that a light bundle emerging from a point converges at the optically conjugate point.

The term "field plane" is used herein to denote a plane that is optically conjugate to the mask plane.

The term "pupil plane" is used herein to denote a plane in which marginal rays passing through different points in the mask plane or another field plane intersect. As usual in the art, the term "pupil plane" is also used if it is in fact not a plane in the mathematical sense, but is slightly curved so that, in a strict sense, it should be referred to as pupil surface.

The term "optical power" is used to denote the ability of an optical element to have a diverging or converging effect on light. An optical element having a positive optical power thus has a converging effect, and an optical element having a negative optical power has a diverging optical effect. Optical elements having an optical power may be of the refractive, the reflective or the diffractive type.

BRIEF DESCRIPTION OF THE DRAWINGS

Various features and advantages of the present invention may be more readily understood with reference to the following detailed description taken in conjunction with the accompanying drawings in which.

DESCRIPTION OF PREFERRED EMBODIMENTS

I. General Construction of Projection Exposure Apparatus

Figure 1:
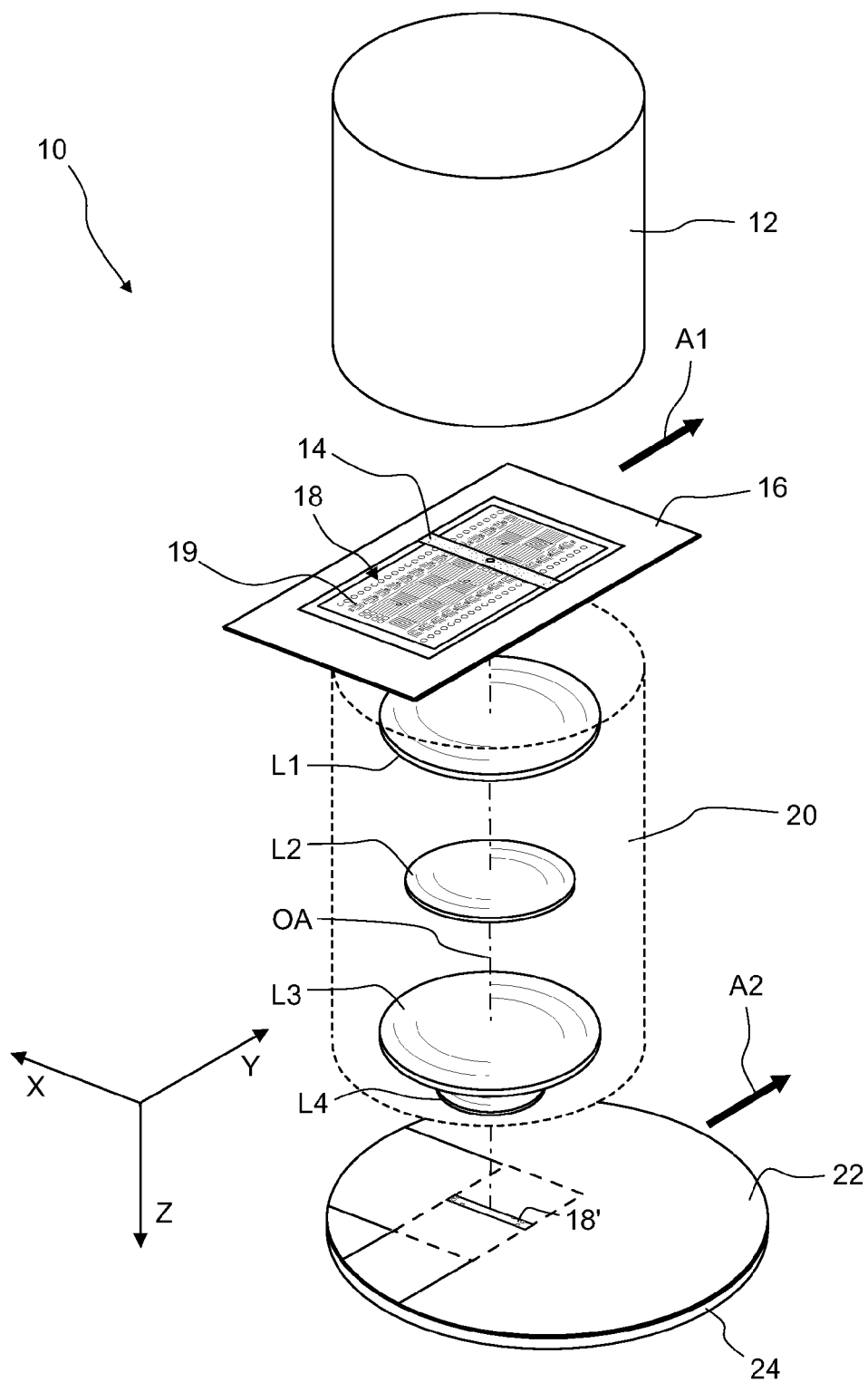
FIG. 1 is a schematic perspective view of a projection exposure apparatus in accordance with one embodiment of the present invention.

FIG. 1 is a perspective and highly simplified view of a projection exposure apparatus 10 in accordance with the present invention. The apparatus 10 comprises an illumination system 12 which produces projection light. The latter illuminates a field 14 on a mask 16 containing a pattern 18 of fine features 19. In this embodiment the illuminated field 14 has a rectangular shape. However, other shapes of the illuminated field 14, for example ring segments, are contemplated as well.

A projection objective 20 having an optical axis OA and containing a plurality of lenses L1 to L4 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification β with |β|<1, a minified image 18' of the pattern 18 within the illuminated field 14 is projected onto the light sensitive layer 22.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification β of the projection objective 20. If the projection objective 20 does not invert the image (β>0), the mask 16 and the substrate 24 move along the same direction, as this is indicated in FIG. 1 by arrows A1 and A2. However, the present invention may also be used with catadioptric projection objectives 20 having off-axis object and image fields, and also in apparatus of the stepper type in which the mask 16 and the substrate 24 do not move during the projection of the mask.

Figure 2:
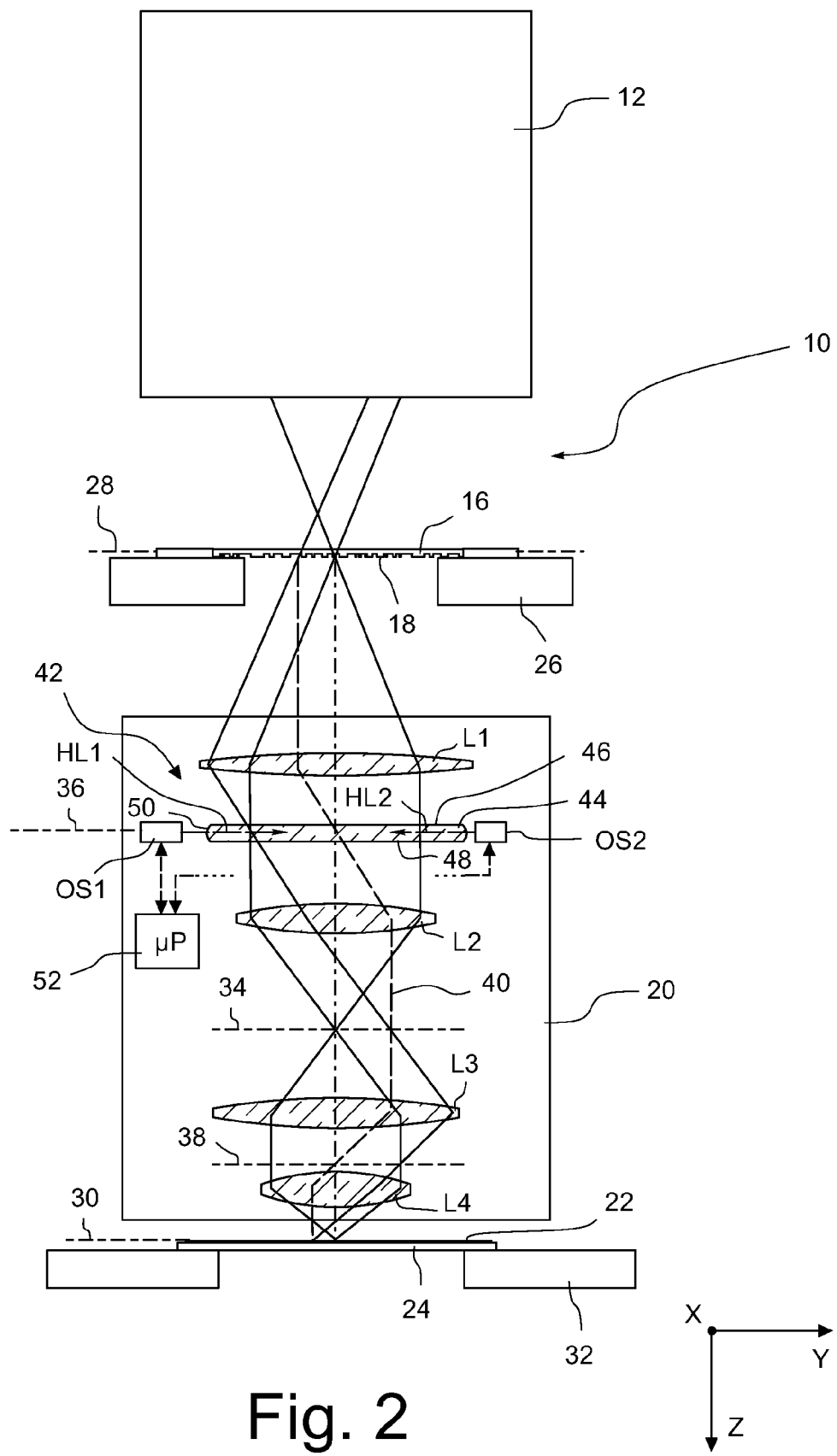
FIG. 2 is schematic meridional section through the apparatus shown in FIG. 1.

FIG. 2 is a schematic meridional section through the apparatus 10 shown in FIG. 1. In this section also a mask stage 26, which supports the mask 16 in an object plane 28 of the projection objective 20, and a wafer stage 32, which supports the substrate 24 in an image plane 30 of the projection objective 20, are shown.

In this embodiment the projection objective 20 has an intermediate image plane 34 and a first pupil plane 36, which is arranged between the object plane 28 and the intermediate image plane 34. A second pupil plane 38 is arranged between the intermediate image plane 34 and the image plane 30 of the projection objective 20. In the pupil planes 36, 38 all light rays converging or diverging under the same angle from any of the field planes, i.e. the object plane 28, the intermediate image plane 34 and the image plane 30, pass through the same point, as this is illustrated in FIG. 2. Furthermore, all light rays intersecting a field plane parallel to the optical axis OA, such as light ray 40 indicated as a broken line, intersect the optical axis OA in the pupil planes 36, 38.

II. Correction Device

The projection objective 20 contains a correction device 42 for correcting wavefront errors. The correction device 42 is arranged in the first pupil plane 36 and includes a refractive optical element 44 having a first optical surface 46 at one side and a second optical surface at an opposite side, through which projection light passes when the mask 16 is imaged on the light sensitive surface 22. The refractive optical element 44 has a circumferential rim surface 50 extending between the two optical surfaces 46, 48. In this embodiment the optical surfaces 46, 48 of the refractive optical element 44 are planar and parallel to each other, and the rim surface 50 is cylindrical. Thus the refractive optical element 44 has the shape of a planar disk.

The correction device 42 further comprises a first optical system OS1 that is configured to direct first heating light HL1 to a first portion of the rim surface 50 such that at least a portion of the first heating light HL1 enters the refractive optical element 44. A second optical system OS2 is also configured to direct second heating light HL2 to a different portion of the rim surface 50 so that at least a portion of the second heating light HL2 enters the refractive optical element 44. The correction device 42 also comprises a third optical system OS3 which is only shown in the cross section of the correction device 42 in the first pupil plane 36 shown in FIG. 3.

The optical systems OS1, OS2, OS3 are in signal communication with a control unit 52 which controls the emission of heating light HL1, HL2, HL3 by the optical systems OS1, OS2 and OS3, respectively.

Figure 3:
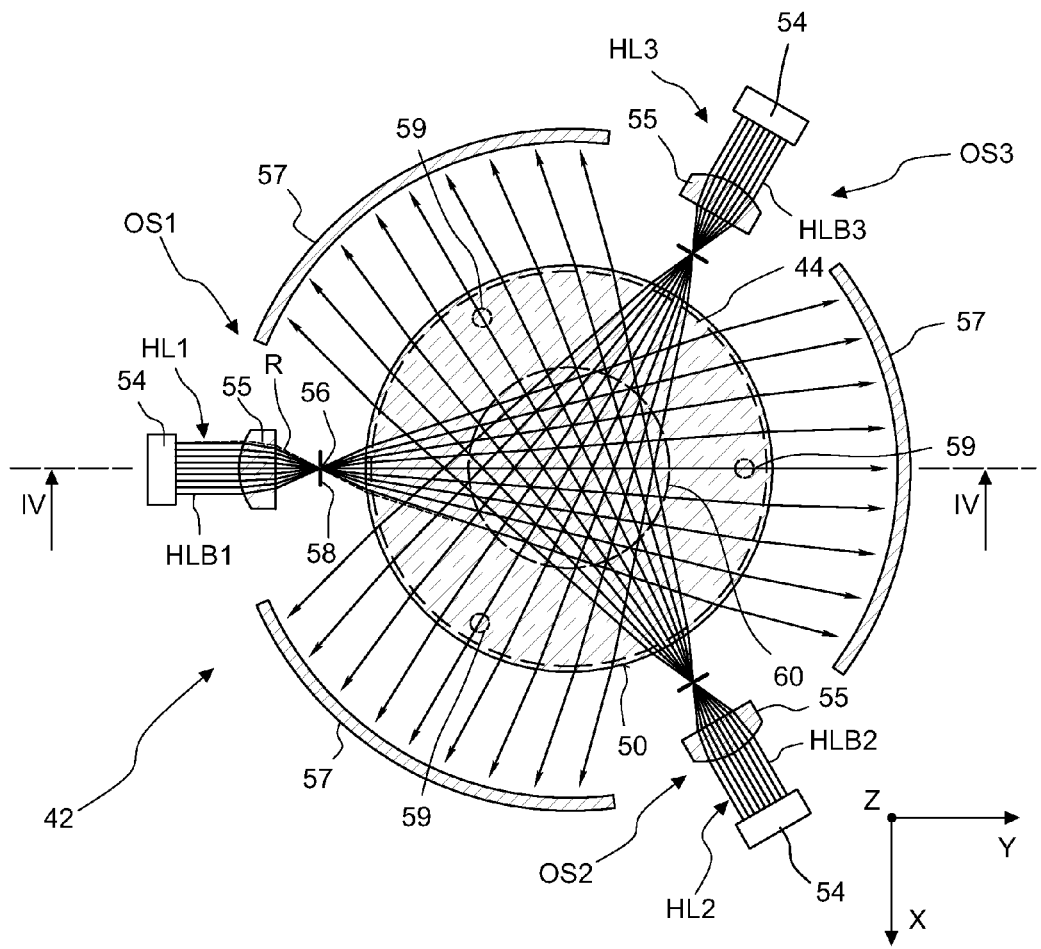
FIG. 3 is a schematic cross section in an XY plane through a correction device according to a first embodiment that is contained in a projection objective being part of the apparatus shown in FIGS. 1 and 2.
Figure 4:
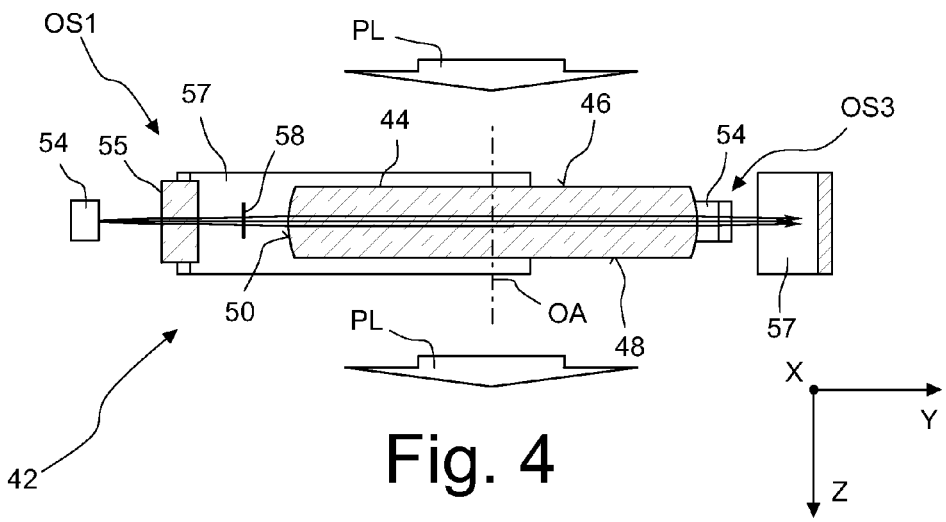
FIG. 4 is a schematic cross section through the correction device shown in FIG. 3 along line IV-IV.

Referring now to the cross sections through the correction device 42 shown in FIGS. 3 and 4, it can be seen that the first optical system OS1 comprises a first light source 54 which is configured to produce a plurality of first heating light beams HLB1 whose intensity can be varied individually by supplying a suitable control command from the control unit 52 to the first optical system OS1. To this end the first light source may comprise a plurality of individual light sources each producing one heating light beam HLB1. Alternatively, the first light source 54 may contain a single light emitter and a splitting mechanism that split the light emitted by the light emitter into the individual heating light beams. The individual heating light beams HLB1 may also be produced successively by a single light emitter using a kind of scanning set-up, for example.

The first optical system OS1 further comprises a cylindrical lens 55 which is arranged in the optical path between the light source 54 and the refractive optical element 44. The cylindrical lens 55 has a positive optical power only in the XY plane, i.e. in a direction perpendicular to the optical axis OA of the projection objective 20. Since the first heating light beams HLB1 are emitted from the light source 54 as parallel light beams, they converge in a focal line 56 which is arranged in a back focal plane of the cylindrical lens 55.

The first heating light beams HLB1 emerging from the focal line 56 impinge on a portion of the rim surface 50 of the refractive optical element 44. As can be seen in FIG. 4, the rim surface 50 is curved so that it has a positive refractive power in all planes containing the optical axis OA, which coincides with the axis of symmetry of the refractive optical element 44. An anti-reflection coating may be applied on the rim surface 50 to reduce reflection of the first heating light beams HLB1 when they impinge on the rim surface 50.

At the rim surface 50 first heating light beams HLB1 are refracted both in the XY plane and also in planes containing the optical axis OA. As far as the refraction in XY planes is concerned, the rim surface 50 of the refractive optical element 44 thus has a similar converging effect as the cylindrical surface of the cylindrical lens 55. However, since the curvature of the rim surface 50 in the XY plane is smaller than the curvature of the cylindrical lens 55, the positive refractive power of the refractive optical element 44 is also smaller than the positive refractive power of the cylindrical lens 55. By carefully selecting the refractive power and the position of the cylindrical lens 55, it is possible to accurately define the angles under which the first heating light beams HLB1 extend through the refractive optical element 44.

The refractive power of the rim surface 50 in planes containing the optical axis OA is used to collimate the slightly diverging individual heating light beams HLB1 in these planes, as this is shown in FIG. 4. The collimation in the XY plane is accomplished by the cylindrical lens 55 and also the curvature of the rim surface 50 in the XY plane, as this is indicated in FIG. 3 by a single diverging ray R indicated as dotted line.

The wavelength of the first heating light HL1 is adapted to the optical material of the refractive optical element 44 such that—in contrast to the projection light denoted in FIG. 4 by PL—a significant portion of the first heating light HL1 is absorbed by the material. The absorbed heating light HL1 leads to a local temperature rise which, in turn, is accompanied by a local change of the refractive index of the refractive optical element 44.

Thus projection light PL passing through the heated portions of the refractive optical element 44 undergo a phase change as compared to projection light PL passing through areas which have not been heated up. This phase change can be used to correct a wavefront error.

The first heating light beams HLB1, or strictly speaking the portion of these light beams that has not been absorbed in the refractive optical element 44, impinges on the opposite rim surface 50 and is refracted again. This portion of the first heating light HL1 may be absorbed by an externally cooled absorber plate 57. Alternatively, this portion of the first heating light HL1 may leave the projection objective 20 through a transparent window so that it does not contribute to the heat balance of the projection objective 20 (not shown).

It is to be noted that even if an anti-reflection coating is applied to the rim surface 50, there will always be a fraction of the first heating light HL1 which is internally reflected at the back rim surface 50. Depending on the angle of incidence this fraction may be considerable. This internally reflected first heating light HL1 will also be gradually absorbed when it passes again through the refractive optical element 44. The internally reflected fraction of the first heating light HL1 will again be incident on another portion of the rim surface 44 where a fraction of the first heating light HL1 is reflected internally, again, etc. Also scattering at material impurities or imperfections at the rim surface 50 may result in a small fraction of the first heating light that propagates along various and unknown directions through the refractive optical element 44.

However, typical light sources 54 such as lasers, laser diodes or LEDs are extremely sensible with regard to light that enters the component through its emission window. Even small light intensities of such light suffice to severely compromise the function of the component or may even damage the component in the short or long term.

The provision of the cylindrical lens 55 and the focal line 56 effectively prevents that internally reflected or scattered first heating light HL1 is able to get back into the light source 54. This is because only light rays passing through the small focal line 56 are capable to impinge on the light source 54.

In principle it would suffice to choose the dimensions of the cylindrical lens 55 such that it is as small as possible. However, it is usually more effective to arrange an additional blind 58 in the back focal plane of the cylindrical lens 55 having an aperture whose shape corresponds to the focal line 56. Then the blind 58 blocks all light rays which do not pass through the focal line 56. In this way a very effective protection of the light source 54 against heating light that is scattered or internally reflected at the rim surface 50 is provided.

The other two optical systems OS2, OS3 are constructed in the same way, i.e. they both comprise a light source 54, a cylindrical lens 55 and a blind 58. The three optical systems OS1, OS2, OS3 are arranged with three-fold symmetry in the first pupil plane 36 so that they are spaced apart by an angle of 120° from each other. As a result of this arrangement, there will be a central portion 60 within the refractive optical element 44 in which fans of the heating light HL1, HL2, HL3 coupled into the refractive optical element 44 by the optical systems OS1, OS2, OS3 completely overlap. In this central portion 60 it is thus possible to produce a wide range of different temperature distributions by individually controlling the intensity of each heating light beam HLB1, HLB2, HLB3 passing through the central portion 60.

The refractive optical element 44 may be supported by a mount structure (not shown) at a plurality of mounting points. Preferably the mounting points are arranged with the same or a similar symmetry as the optical systems OS1, OS2, OS3. In particular, the mounting points may be located on or in close proximity to the optical axis of the optical systems OS1, OS2, OS3, as this is indicated in FIG. 3 by small circles 59 representing the mounting points. Furthermore, it may be preferred to arrange the mounting points 59 at the side of the refractive optical element 44 where the heating light HL1, HL2, HL3 leaves the refractive optical element 44.

Generally the refractive optical element 44 may be fastened to a mount structure at the mounting points 59 by gluing or clamps, for example. If clamps are used, care should be taken that heating light emerging from the refractive optical element is not reflected back such that the heating light enters the refractive optical element again in an uncontrolled manner.

In order to facilitate the adjustment of the aforementioned optical components during the assembly of the correction device 42, it may be expedient to design the optical components such that they are achromatic for an adjustment wavelength which is in the visible spectrum. Then the path of the heating light beams HLB1, HLB2, HLB3 may be tested during the adjustment with the help of visible light that is produced by a light source being arranged, for example, at positions where the heating light beams HLB1, HLB2, HLB3 leave the refractive optical element 44.

An even simpler, but less convenient approach is to use during the adjustment process special films that change their color under the impact of the heating light beams HLB1, HLB2, HLB3.

III. Control of Correction Device

In a first step the wavefront errors which shall be corrected with the help of the correction device 42 have to be determined by simulation and/or measurement. Measurements may involve the detection of an aerial image formed in the image plane 30 of the projection objective 30 with the help of an interferometric wavefront measuring device. The deviation of the measured wavefronts from an ideal wavefront is considered as wavefront error that is to be corrected.

Since the correction device 42 is arranged in the first pupil plane 36, it will affect the wavefront associated with different field points in the same manner. If it is desired to perform a correction of field dependent wavefront errors, it is necessary to arrange the correction device 42 outside the pupil planes 36, 38, or to provide a second correction device in or in close proximity to a field plane, for example the intermediate image plane 34.

Once the wavefront errors and the necessary corrections have been determined, the intensities of the individual heating light beams HLB1, HLB2, HLB3 can be calculated using established optimization approaches. In this context the following steps may be carried out:

In a first step it has to be determined where the heating light beams HLB1, HLB2, HLB3 pass through the central portion 60 of the refractive optical element 44.

In a second step the absorption for first, second and third heating light beams HLB1, HLB2, HLB3 has to be determined. Usually the heating light beams HLB1, HLB2, HLB3 produced by the three optical systems OS1, OS2 and OS3, respectively, will have the same center wavelength. In that case the coefficient of absorption of the material of the refractive optical element 44 will be equal for all heating light beams HLB1, HLB2, HLB3. Preferably the coefficient of absorption is measured for a particular refractive optical element 44, because even glass blanks of the same glass type may have slightly different compositions and thus slightly different coefficients of absorption for the heating light beams HLB1, HLB2, HLB3. If the refractive element 44 is made of a glass, the coefficient of absorption often strongly depends on the concentration of OH molecules. Since the concentration of OH molecules may not be perfectly homogeneous in the blank, it may even be necessary to measure the coefficient of absorption for different ray paths and to store these measurement values so that they can be used during later computational steps.

In a next step a computing field is determined which is formed by an array of pixels, for example 65×65, 201×201 or 1001×1001 (square) pixels. An uneven number of pixels along the X and the Y direction is advantageous because then one pixel can be positioned computationally on the optical axis OA running through the center of the refractive optical element 44. The larger the number of pixels is, the more accurate will be the computation of the effect of the refractive optical element 44 on an optical wavefront. However, a larger number of pixels increases the computing time and may even raise stability issues such as increased sensibility against noise. Therefore a reasonable compromise has to be found with regard to the number of pixels in the pixel field.

In this pixel field the circular circumference of the refractive optical element 44 is computationally placed. At this computational rim surface the locations where the individual heating light beams HLB1, HLB2, HLB3 enter the refractive optical element 44 and the propagation direction within the refractive optical 44 are determined.

Each heating light beam HLB1, HLB2, HLB3 is now considered as a manipulator which has an impact on the wavefront that passes through the central portion 60 of the refractive optical element 44. Then well-established optimization approaches may be used to determine the intensities of the individual heating light beams so as to obtain the desired effect on the optical wavefront. To this end the following procedure may be carried out for each heating light beam:

First, a basic intensity and a basic time over which this intensity is maintained are determined as a starting point. Then it is determined which pixels of the pixel field are completely or partially affected by a particular heating light beam HLB1, HLB2, HLB3. For each pixel affected by the heating light beam HLB1, HLB2, HLB3 the residual intensity of the light beam HLB1, HLB2, HLB3 is computed. This residual intensity depends on the initial intensity, the coefficient of absorption of the refractive optical element 44 and the geometrical path length in it. As mentioned above, the coefficient of absorption may depend on the particular ray path that is associated with the heating light beam HLB1, HLB2, HLB3. On the basis of this residual intensity and the coefficient of absorption, the amount of energy which is dissipated as heat at the particular pixel is computed.

Now the temperature profile produced by the particular heating light beam HLB1, HLB2, HLB3 is computed on the basis of the amount of heat absorbed at the particular pixel. If the refractive optical element 44 is constantly cooled so as to obtain a constant average temperature, this cooling effect is also taken into account. Also time dependent effects (in particular heat conduction within the refractive optical element 44) are considered.

From this temperature profile a refractive index profile can be computed and assigned to the particular heating light beam HLB1, HLB2, HLB3, since the refractive index is a well-known function of the temperature. On the basis of this refractive index profile the effect of the heating light beam HLB1, HLB2, HLB3 on the optical wavefront can be computed using optical design programs. In this context it may be advantageous to increase the resolution of the pixel field computationally by interpolation.

After the effect of the individual heating light beams HLB1, HLB2, HLB3, which may be regarded as elementary manipulators, has been determined, an optimization problem has to be solved so that the interaction of all heating light beams HLB1, HLB2, HLB3 (and possibly of additional manipulators contained in the projection objective 20) achieves the desired correction of the wavefront error. Such optimization processes are known in the art. For example, singular value decomposition (SVD) or Tikhonov regularization may be used in this respect. Another approach based on Convex Programming is described in WO 2010/034674 A1.

A modified approach for controlling the intensities of the heating light beams may include the step of determining off-line the necessary intensities of the heating light beams HLB1, HLB2, HLB3 that are required for producing specific refractive index distributions. These specific distributions may be described, for example, by certain Zernike polynomials which are often used to describe wavefront errors. For each such refractive index distribution the necessary intensities are determined in the manner explained above, for example using a singular value decomposition or a Tikhonov regularization.

During the operation of the projection exposure apparatus 10 the desired refractive index distribution is decomposed into a linear superposition of the specific (Zernike) distributions for which the necessary intensities of the heating light beams HLB1, HLB2, HLB3 have been determined off-line. The resulting intensities for the individual heating light beams HLB1, HLB2, HLB3 are then simply a sum of the intensities that are associated with the specific distributions, but weighed by superposition coefficients. This usually results in a much quicker determination of the necessary intensities for the individual heating light beams HLB1, HLB2, HLB3.

IV. Alternative Embodiments

In the following various alternative embodiments will be described with reference to FIGS. 5 to 10.

Figure 5:
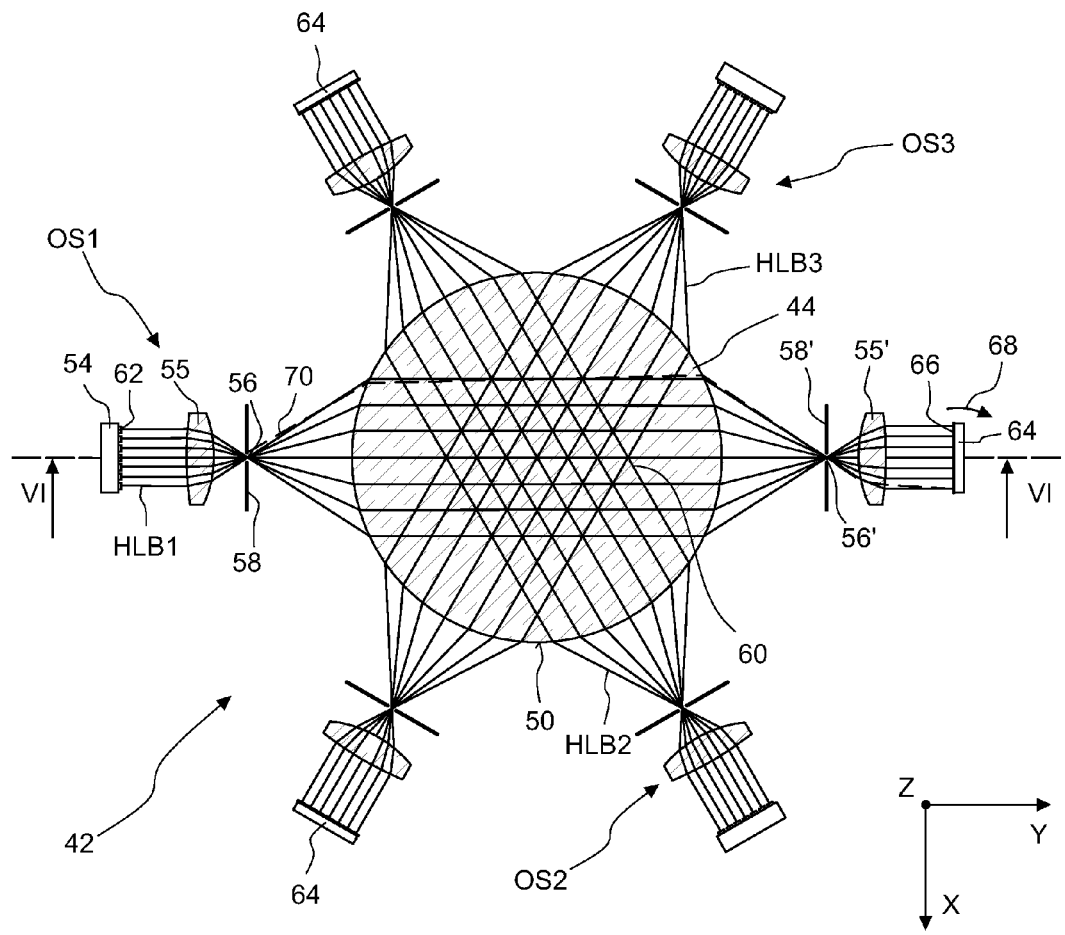
FIG. 5 is a schematic cross section in an XY plane through a correction device according to a second embodiment containing mirrors that reflect heating light back into the refractive optical element.
Figure 6:
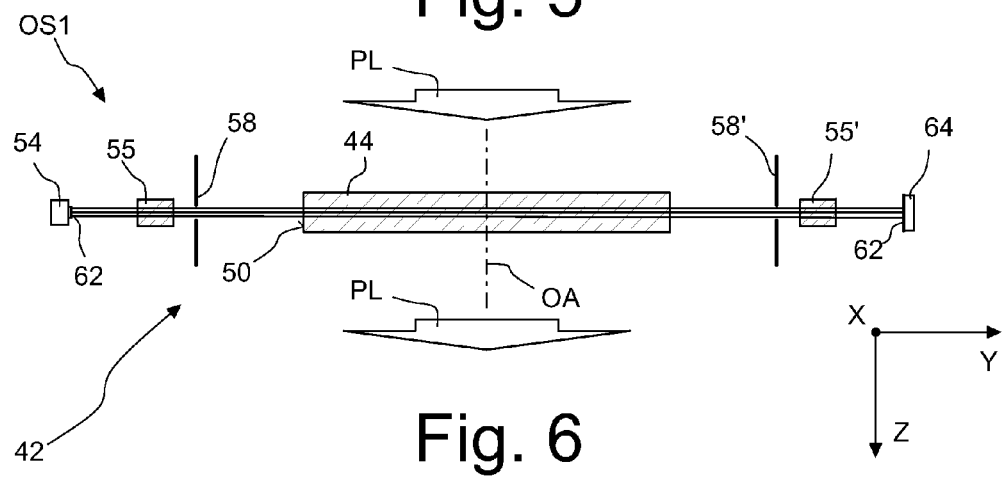
FIG. 6 is a schematic cross section through the correction device shown in FIG. 5 along line VI-VI.

FIGS. 5 and 6 are cross sections in an XZ and an YZ plane, respectively, through a correaction device 42 according to a second embodiment. The same reference numerals are used for denoting identical or corresponding components.

Again the particular features of the correction device 42 will be only described with reference to the first optical system OS1; the other two optical systems OS2, OS3 have the same composition, but are arranged at different angular orientations in the XY plane.

In this second embodiment the light source 54 comprises a plurality of first light sources that are each configured to produce one of the first heating light beams HLB1. Each first light source is formed by an LED 62 to which a minute microlens (not shown) is attached that collimates the light emitted by the LED. The intensity of the individual first heating light beams HLB1 is controlled electronically by the control unit 52.

In contrast to the first embodiment shown in FIGS. 3 and 4, the first optical system OS1 produces first heating light beams HLB1 running parallel or nearly parallel after they have entered the refractive optical element 44. This results in a more regular arrangement of heating light beams HLB1 in the central portion 60 of the refractive optical element 44 which, in turn, facilitates an accurate production of the desired temperature distribution in this portion and makes it easier to collect the heating light beams HLB1 after they left the refractive optical element 44. The regular arrangement of the heating light beams HLB1 is mainly achieved by suitably adapting the refractive power of the cylindrical lens 55 and its distance from the refractive optical element 44 to the curvature of the rim surface 50 in the XY plane.

Last but not least the first optical system OS1 comprises a mirror 64 having a reflective surface 66 that reflects first heating light HL1 after it has traversed the reflective optical element 44. In other words, the fraction of the first heating light beams HLB1, which is not internally reflected at the rim surface 50, is refracted at this rim surface 50 and converges to a focal line 56' which is arranged in a front focal plane of a cylindrical lens 55'. Thus the first heating light beams HLB1 impinge, again parallel to each other, on the reflective surface 66. Consequently, the first heating light beams HLB1 take the same way when they return from the reflective surface 66 towards the light source 54. This has the advantage that less heating light is lost, which has a positive impact on the efficiency of the correction device 42.

In order to prevent that the first heating light beams HLB1 reflected from the mirror 64 enter the LEDs 62, the mirror 64 comprising the reflective surface 66 is slightly tilted, as it is indicated in FIG. 5 by an arrow 68. As a result of this tilted arrangement, the first heating light beams HLB1 take a slightly different route on their way back towards the light source 54. For one of the first heating light beams the route back towards the light source 54 is indicated with a broken line 70. It can be seen that the reflected heating light beam 70 does not pass exactly through the focal line 56, is therefore absorbed by the blind 58 and thus cannot enter one of the LEDs 62 of the light source 54.

In some cases the rim surface 50 of the refractive optical element 40 may not be easily accessible because it is obstructed by a mount which is required to precisely adjust the refractive optical element in the propagation path of the projection light PL. This particularly applies in those cases in which the optical surfaces 46, 48 of the refractive optical element 44 are curved and therefore have a refractive power.

Figure 7:
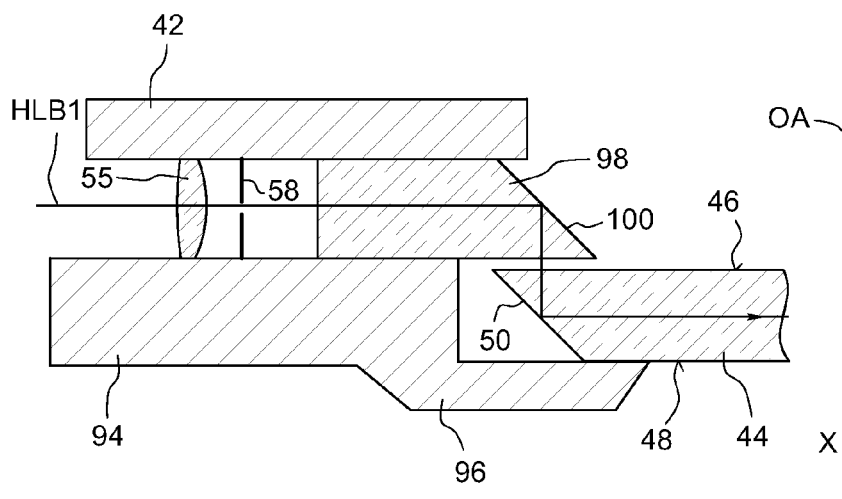
FIG. 7 is a partial and enlarged cross section in an XZ plane through a rim portion of the refractive optical element.

FIG. 7 shows a partial and enlarged cross section through a rim portion 50 of the refractive optical element 44. Here at least the portion of the rim surface 50, on which a heating light beam HLB1 impinges, forms an angle of 45° with respect to the optical axis OA at a position where the refractive optical element 44 is arranged (it is to be noted that the optical axis OA may have different orientations in other portions of the projection objective 20).

A mount structure 94 has on one side a web 96 which supports the second optical surface 48 of the refractive optical element 44. At the opposite side of the mount structure 94 the cylindrical lens 55, the blind 58 and a light deviating element 98 formed by a prism are arranged. The beam deviating element 98 has a surface 100 which is inclined with respect to the optical axis OA. If the angle of inclination with respect to the optical axis OA also equals 45°, the first heating light beam HLB1 entering the beam deviating element 98 undergoes total internal reflection at the inclined surface 100 of the beam deviating element 98 so that the beam direction is deviated by 90°. The first heating light beam HLB1 then enters the refractive optical element 44 and undergoes again total internal reflection at its inclined rim surface 50. This results in a second deviation by 90° so that the first heating light beam HLB1 finally propagates again in a direction perpendicular to the optical axis OA through the refractive optical element 44.

Thus the plane, in which the heating light beam HLB1 propagates when it enters the light deviating element 98, is parallel to a plane in which it propagates through the refractive optical element 44. This makes it possible to arrange the cylindrical lens 55 and also the blind 58 completely above or completely below the rim surface 50 of the refractive optical element 44. In this manner the constraints regarding the available volume can be relaxed by distributing the various components of the optical systems OS1, OS2, OS3 in layers having different Z positions along the optical axis OA.

Figure 8:
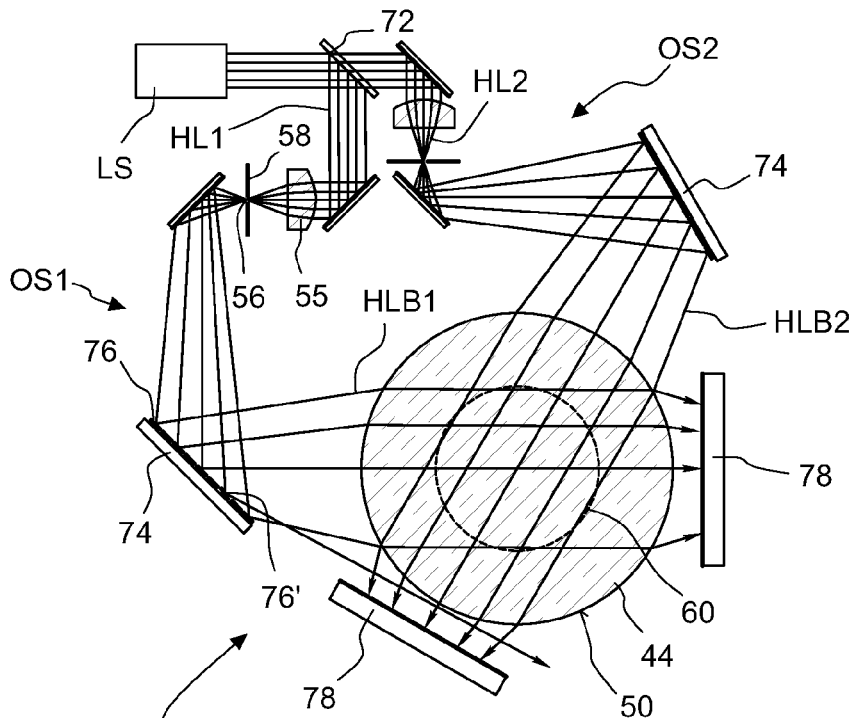
FIG. 8 is a schematic cross section in an XY plane through a correction device according to a third embodiment comprising a mirror array as a spatial light modulator.

FIG. 8 is a cross section through a correction device 42 according to a third embodiment in the first pupil plane 36. The same reference numerals are used for denoting identical or corresponding components.

The correction device 42 of the third embodiment comprises a single light source LS, which is configured to emit heating light, and a beam splitter 72 that splits the heating light into first heating light HL1 and second heating light HL2. The light source LS is realized in this embodiment as a laser which produces a single beam of heating light.

In order to be able to produce a plurality of first and second heating light beams HLB1, HLB2, HLB3 whose intensity can be varied individually, each optical system OS1, OS2 comprises a spatial light modulator 74 which is, in the embodiment shown, realized as an array of tiltable mirrors 76. Here each tiltable mirror 76 has an "on" state in which it directs the impinging heating light as an individual heating light beam HLB1, HLB2 or HLB3 towards the refractive optical element 44. If the mirror 76 is in an "off" state, as it is shown for one mirror 76' of the first optical system OS1, the impinging heating light is reflected such that it does not impinge on the refractive optical element 44.

Heating light beams HLB1, HLB2 that leave the refractive optical element 44 impinge on an absorber 78. Active or passive cooling of the absorber may be particularly important if the refractive optical element 44 absorbs only a small fraction of the heating light beams HLB1, HLB2, as this is the case, for example, for heating light having a wavelength of about 1450 nm in typical optical glasses.

Since the intensity of the heating light beams HLB1, HLB2 can be varied only between a maximum value and zero, the amount of energy which shall be absorbed by the refractive optical element 44 along the propagation path of the heating light beams has to be adjusted by the ratio of the times, during which a mirror 76 is in the "on" state, and the times during which this mirrors 76 is in the "off" state.

Figure 9:
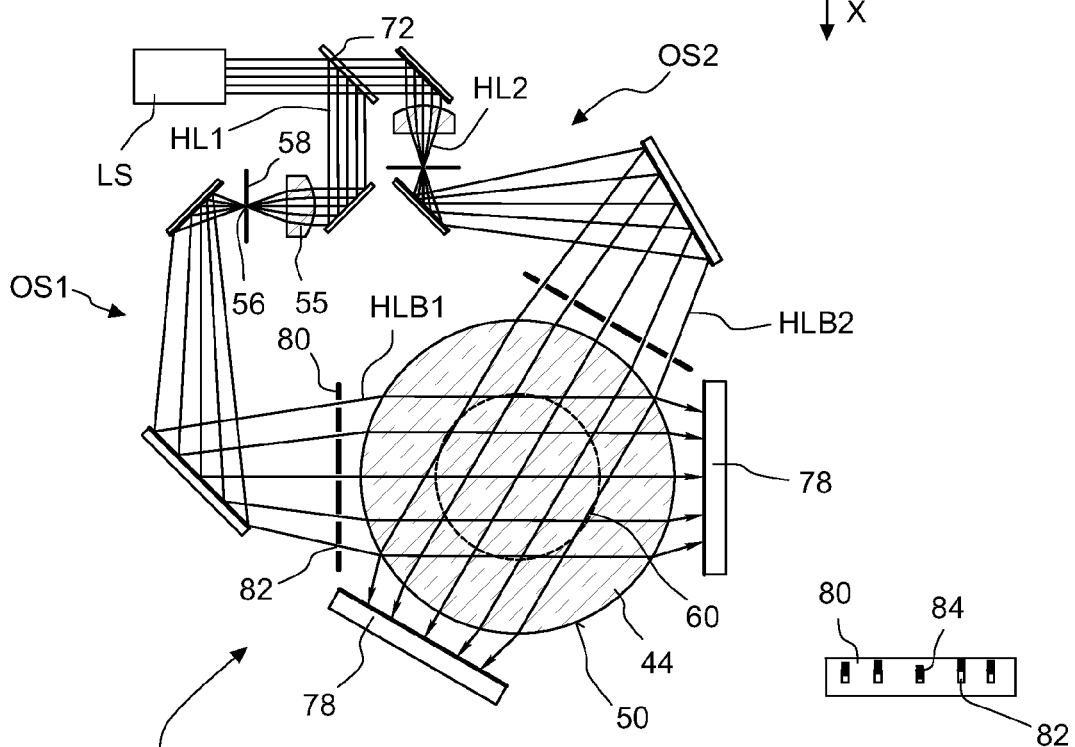
FIG. 9 is a schematic cross section in an XY plane through a correction device according to a fourth embodiment comprising a variable blind as a spatial light modulator.
Figure 10:
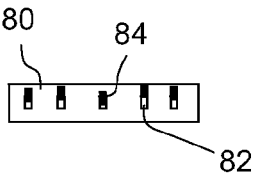
FIG. 10 is a front view on the variable blind contained in the correction device shown in FIG. 9.

FIG. 9 shows, in a cross section similar to FIG. 8, a correction device 42 according to a fourth embodiment. In this embodiment the spatial modulators are not formed by mirror arrays, but by variable blinds 80. As can also be seen in the front view of FIG. 10 on one of the blinds 80, each blind 80 has a plurality of apertures 82 whose size can be changed individually in response to the control signal supplied by the control unit 52. Each aperture 82 is associated with one of the heating light beams HLB1, HLB2.

To this end the variable blind 80 comprises shutter elements 84 that can be displaced, with the help of actuators (not shown) so that they partly or completely overlap the apertures 82.

As a matter of course, other types of a variable blinds are considered as well. For example, blinds may be used that contain LCD elements which can be switched between an "on" state, in which they are transparent for the heating light, and an "off" state, in which they are opaque for the heating light. In that case the intensities of the associated heating light beam can be adjusted, in the time average, by suitably setting the ratio of the times, during which an LCD element is in the "on" state, and the times during which this LCD element is in the "off" state.

As a matter of course, a third or even more optical systems may be provided in addition to the optical systems OS1, OS2 shown in FIGS. 8 and 9.

V. Other Correction Devices

Figure 11:
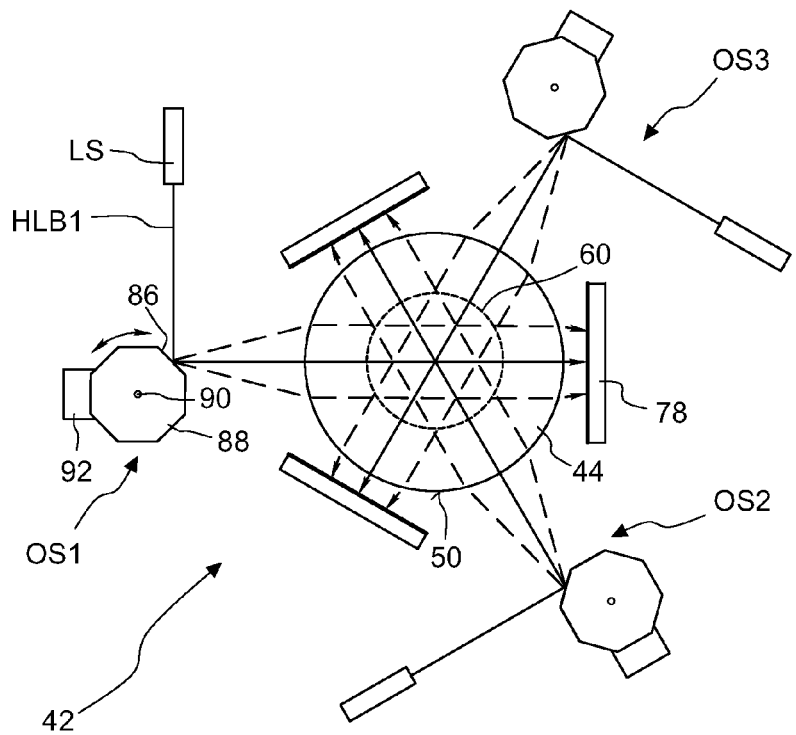
FIG. 11 is a top view of a correction device using a scanner set-up as spatial light modulator.

FIG. 11 shows an embodiment of a correction device 42 in which the spatial light modulator comprises a reflective surface 86 which is part of a polygon mirror 88. The polygon mirror 88 can be turned around a rotational axis 90 with the help of a driver 92 so that the spatial orientation of the reflective surface 86 can be continuously changed. If a first heating light beam HLB1, which may be emitted by a light source LS formed by a laser diode, for example, is directed on the reflective surface 86, it is possible to direct the first heating light beam HLB1 at different angles on different portions of the rim surface 50 of the refractive optical element 44. In this embodiment a plurality of heating light beams is thus not produced simultaneously, but subsequently using a kind of scanner set-up.

As in the previous embodiments, the other two optical systems OS2, OS3 have the same configuration as the optical system OS1.

Figure 12:
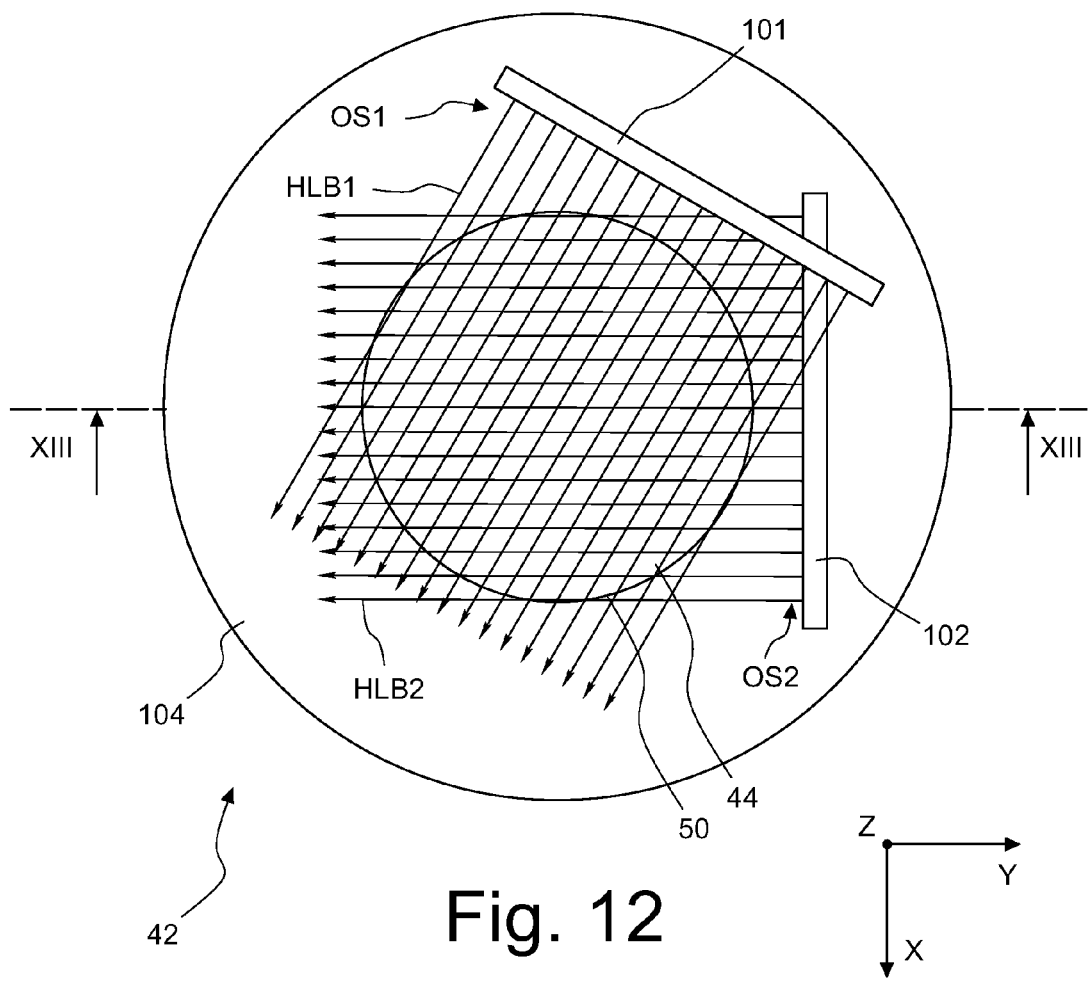
FIG. 12 is a schematic cross section through a correction device in which a refractive optical element and LED bars are immersed in an optical adhesive.
Figure 13:
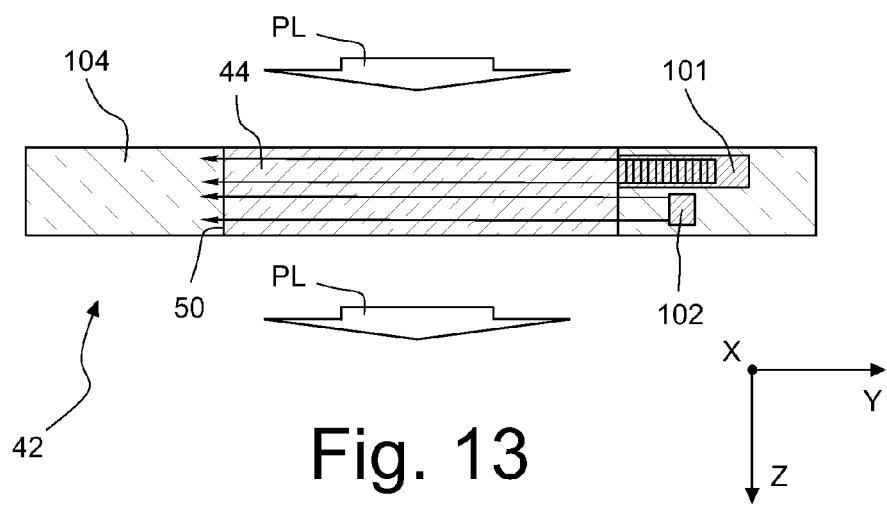
FIG. 13 is a schematic cross section through the correction device shown in FIG. 12 along line XIII-XIII.

FIGS. 12 and 13 schematically show a correction device 42 according to a further embodiment in a top view and a cross section along line XIII-XIII in the pupil plane 36, respectively. In this embodiment the first optical system OS1 essentially consists of a bar 101 comprising a plurality of LEDs and associated microlenses (not shown) that collimate the first heating light beams HLB1 emitted as parallel beams by the LEDs. A second bar 102 forming the second optical system OS2 has a similar construction, but is arranged in a different plane, as it becomes clear from the cross section shown in FIG. 13. If a third bar is provided, too, this may be arranged in a third plane which is arranged at a distance from the other two planes along the Z direction.

In order to suppress refraction at the rim surface 50 of the refractive optical element 44, the latter and the bars 101, 102 are immersed in an optical adhesive 104 having approximately the same refractive index as the refractive optical element 44. Such optical adhesive 104 are known in the art as such and may cure under the impact of UV light, for example. In the absence of a refractive index step at the rim surface 50, the heating light beams HLB1, HLB2 emitted by the bars 101, 102 traverse also the refractive optical element 44 in parallel, similar to the embodiment shown in FIGS. 5 and 6. In other embodiments the optical adhesive 104 is replaced by a liquid such as water.

Figure 14:
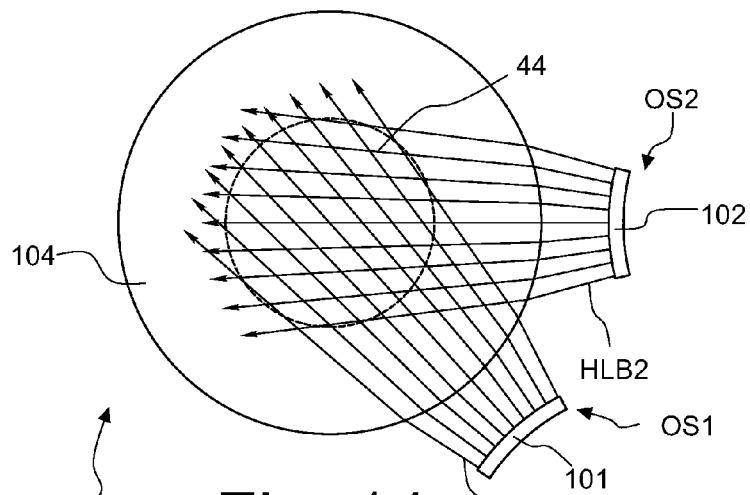
FIG. 14 is a top view on a correction device in which two curved LED bars are used as light sources.

FIG. 14 is a top view on a correction device according to an embodiment in which the refractive optical element 44 is not immersed in an optical adhesive. Bars 101, 102 containing LEDs are arranged such that the heating light beams HLB1, HLB2 emitted by the LEDs of the bars 101 and 102, respectively, overlap in the central portion 60 of the refractive optical element 44. The bars 101, 102 are curved so that the heating light beams HLB1, HLB2 are not emitted in parallel, but in a fan-like manner. The divergence of the fans is so large that, in spite of the converging effect produced by the rim surface 50 of the refractive optical element 44, each fan of heating light beams HLB1 or HLB2 completely covers the central portion 60. Nevertheless the bars 101, 102 are so short that they can be arranged in a single plane which is parallel to or identical with the first pupil plane 36.

Figure 15:
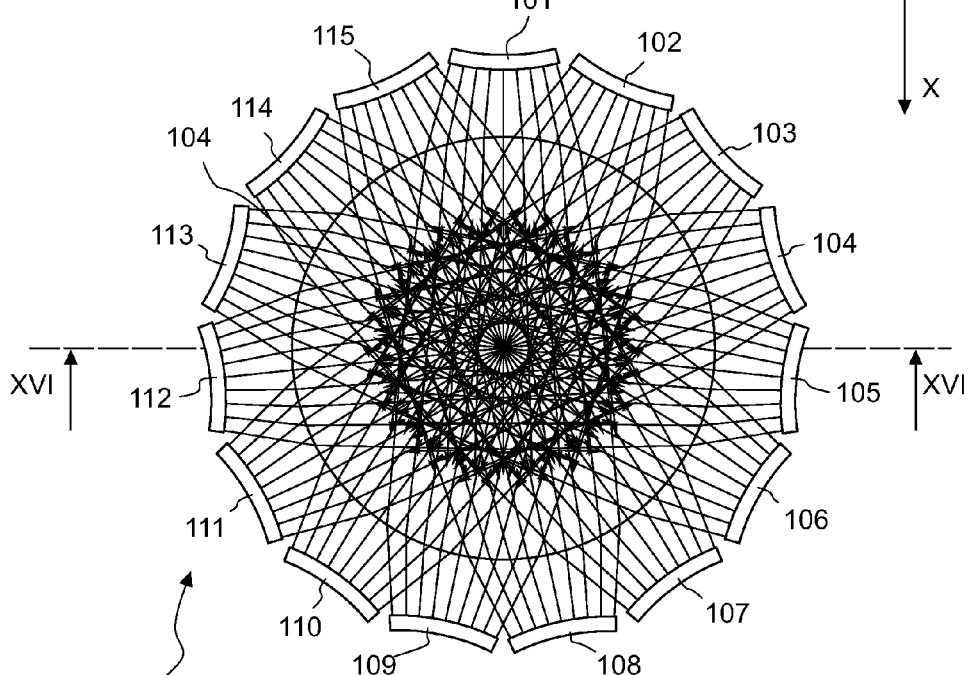
FIG. 15 is a top view of a correction device similar to the device shown in FIG. 14, but comprising 15 LED bars.
Figure 16:
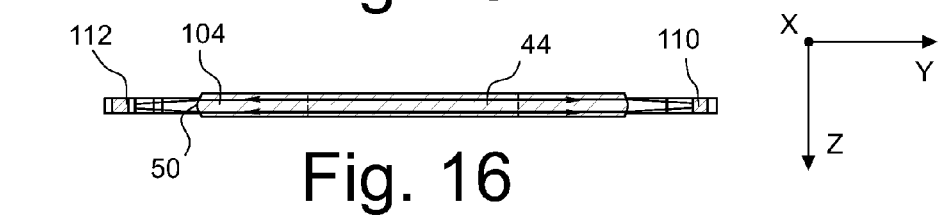
FIG. 16 is a schematic cross section through the correction device shown in FIG. 15 along line XVI-XVI.

FIGS. 15 and 16 schematically show a correction device 42 according to a still further embodiment in a top view and a cross section along line XVI-XVI in the pupil plane 36, respectively. In this correction device 42 not only two, but 15 bars 101 to 115 are arranged around the refractive optical element 44 in the same plane. A very dense superposition of heating light beams is achieved in this manner in the central portion 60 of the refractive optical element 44.

In order to achieve also a converging effect along the Z direction, the rim surface 50 of the refractive optical element 44 of this embodiment has a curvature in planes containing the optical axis OA. As can be seen best in the cross section of FIG. 16, divergent light emitted by the LEDs of the bars 101 to 115 is then collimated.

Figure 17:
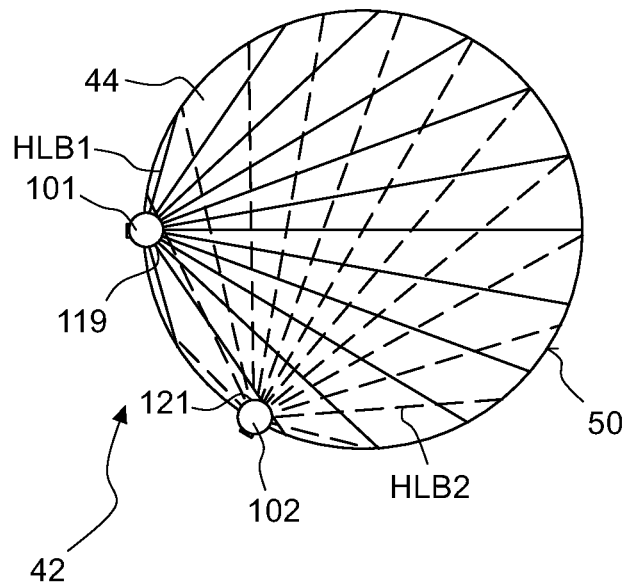
FIG. 17 is a top view of a correction device in which two strongly curved LED bars are arranged in recesses at the rim surface of the refractive optical element.

FIG. 17 is a top view on a correction device 42 according to an embodiment in which minute bars 101, 102 each containing a plurality of LEDs are so strongly curved that the fan of heating light beams covers a very large area of the refractive optical element 44. The bars 101, 102 are received in cylindrical recesses 119, 121 provided at the rim surface 50 of the refractive optical element 44. The diameter of the recesses 119, 121, is adapted such that the individual heating light beams HLB1, HLB2 emitted by the LEDs enter the refractive optical element 44 perpendicularly so that no refraction and minimum reflection occurs.

Figure 18:
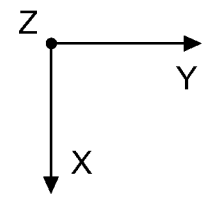
FIG. 18 is a top view of a correction device in which two strongly curved LED bars are arranged in bores provided in the refractive optical element.
Figure 18:
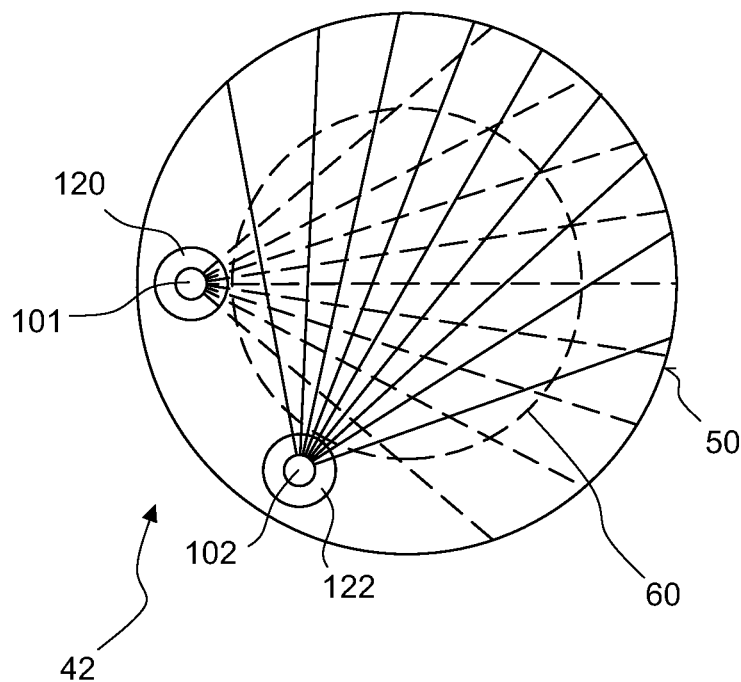

The recesses 191, 121, provided at the rim surface 50 may be replaced by bores or another type of hole that accommodates the circular arrangement of LEDs, as it is shown in the top view of FIG. 18. The bars 101, 102 arranged in bore 120, 122 produce smaller fans of heating light beams, but these fans are still sufficient to completely cover the central portion 60 of the refractive optical element 44 through which also projection light passes during operation of the projection exposure apparatus 10.

Figure 19:
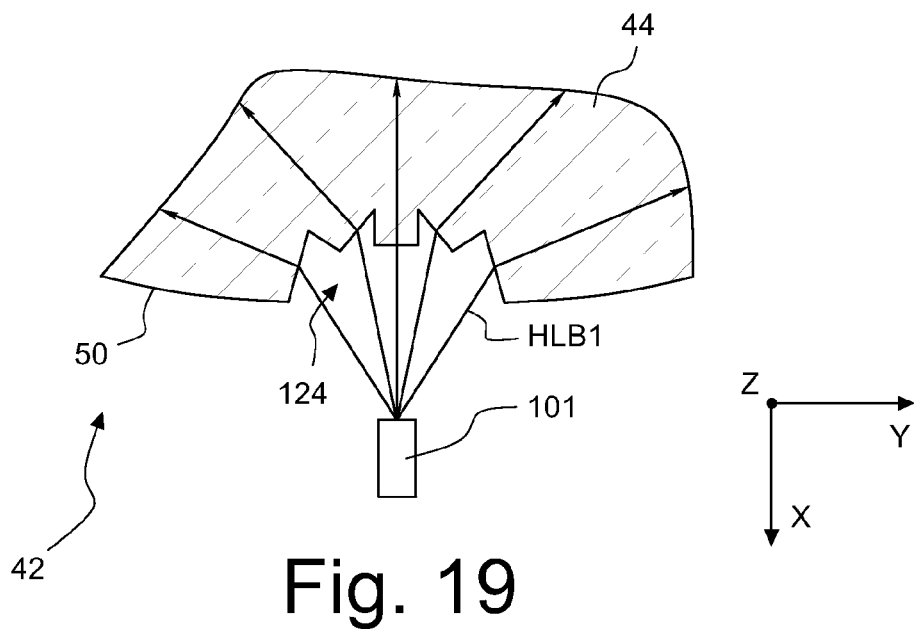
FIG. 19 shows a detail of a portion of the rim portion of the refractive optical element containing a Fresnel lens.

FIG. 19 shows a detail of a refractive optical element 44 according to a still further embodiment. Similar to the embodiment shown in FIG. 17, a light source 101 producing a fan of individual heating light beams HLB1 is arranged very closely to the rim surface 50 of the refractive optical element 44. Here the recess formed at the rim surface 50 does not have a cylindrical shape, but forms, in a YZ plane, a diverging Fresnel lens. Thus the original fan of heating light beams HLB1 emitted by the light source 101 is expanded by the Fresnel lens 124 into a fan having a much wider angular width.

Figure 20:
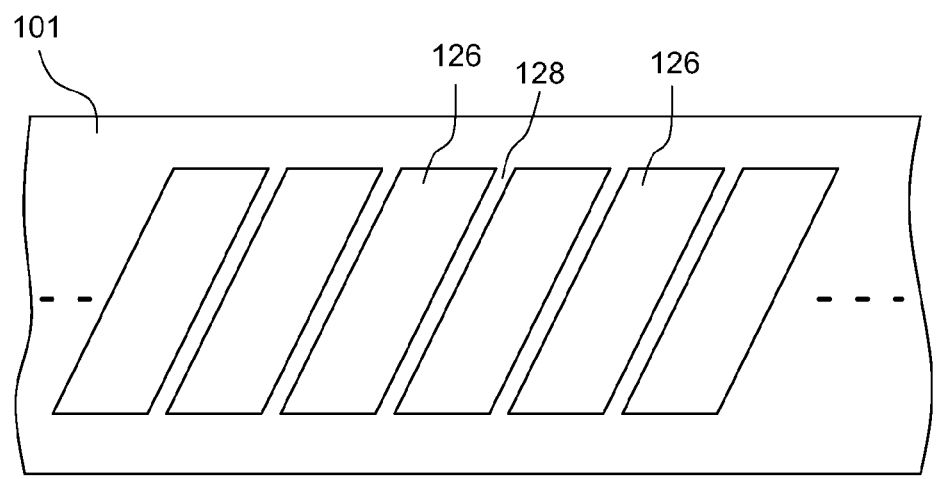
FIG. 20 is a schematic front view of a bar containing a plurality of laser diodes.

FIG. 20 is a schematic front view of a bar 101 containing laser diodes. The exit windows 126 of the laser diodes (or blinds arranged in front the exit windows) have the shape of parallelograms. Gaps 128 between adjacent exit windows 126 are dimensioned such that there are no coordinates along the circumferential direction (in FIG. 20 coinciding with the X direction) at which no heating light emitted by the laser diodes impinges on the refractive optical element 44. This results in a more homogenous heating of the refractive optical element 44 as compared to the case in which rectangular exit windows were arranged side by side separated by gaps that are also rectangular.

Figure 21:
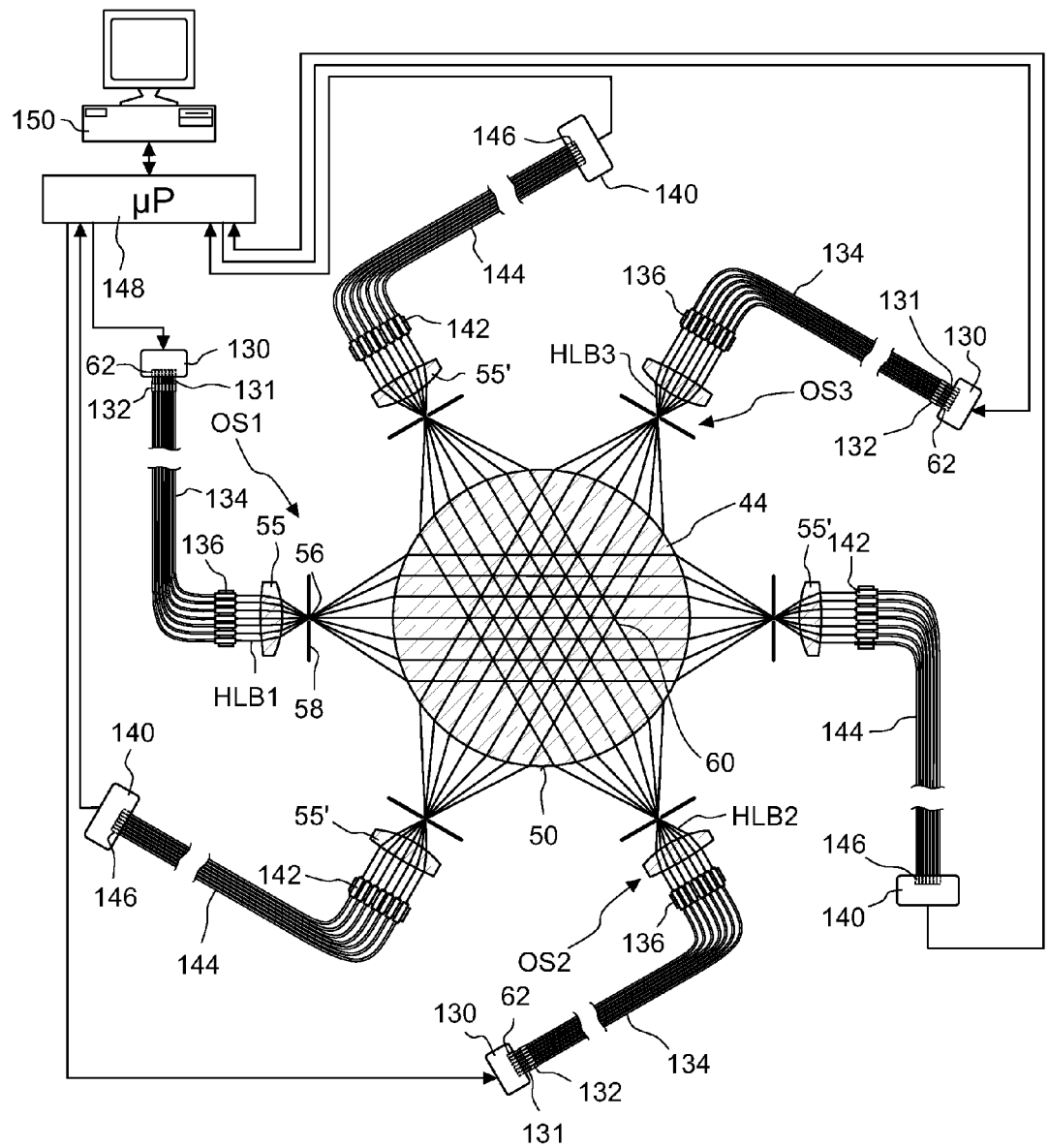
FIG. 21 is a schematic cross section in an XY plane through a correction device according to another embodiment in which optical fibers are used to convey heating light from a remote heating light source to the refractive optical element.

FIG. 21 is a schematic cross section in an XY plane through a correction device 42 according to another embodiment. This embodiment differs from the embodiment shown in FIGS. 5 and 6 mainly in that the LEDs 62 producing the individual heating light beams HLB1, HLB2, HLB3 are not arranged inside the projection objective 20, but are combined in LED packages 130 which are arranged at some place outside the projection objective 20. The LED packages comprise optical output fibers 131 and coupling optics (not shown) that couple the heating light beams HLB1, HLB2, HLB3 emitted from the LEDs 62 into the optical output fibers 131. Each LED package further comprises a releasable multi-fiber connector 132 that connects the bundle of optical output fibers 131 to a bundle of optical input fibers 134. In the latter the heating light beams HLB1, HLB2, HLB3 are guided to output optics 136 which directs the heating light beams HLB1, HLB2, HLB3 to the focusing lens 55 of the respective optical system OS1, OS2, OS3.

The arrangement of the LED packages 130 outside the projection objective 20 has the advantage that a replacement of the LEDs 62 is greatly facilitated. If one or more LEDs 62 malfunctions or completely ceases to emit light at the end of their lifetime, the complete LED package 130 may be simply disconnected from the bundle of optical input fibers 131 and replaced by a new package using the multi-fiber connector 132. Since the LED packages 130 are arranged outside the projection objective 20, this can be accomplished without dismounting any parts of the projection objective 20.

Another advantage is that any power dissipation involved with the generation of the heating light beams occurs outside the projection objective 20. This helps to keep the projection objective 20 at a constant temperature.

In the embodiment shown in FIG. 21, the irradiances, or at least irradiance variations, of the heating light beams HLB1, HLB2, HLB3 after they have left the refractive optical element 44, are measured by detectors 140 which are also arranged outside the projection objective 20. To this end the heating light beams HLB1, HLB2, HLB3 are coupled, after leaving the refractive optical element 44 and traversing the lenses 55', by coupling optics 144 into optical fibers 142. The latter individually guide the heating light beams HLB1, HLB2, HLB3 to photodiodes 146 or other light sensitive elements that are arranged inside the detectors 140. Since also the detectors 140 are arranged outside the projection objective, also the heat which is dissipated at the photodiodes 146 cannot influence the heat balance of the projection objective 20.

The measurement of the irradiance of the heating light beams HLB1, HLB2, HLB3 makes it possible to monitor the proper function of the LEDs 62. Furthermore, it is possible to establish a closed loop control in which the LEDs 62 inside the LED packages 130 are controlled depending on the irradiances measured by the detectors 140. To this end the LED packages 130 and the detectors 140 are connected by electrical signal lines to a control unit 148 which is connected to an overall system control 150 that controls the overall function of the projection exposure apparatus 10. Any variation of the irradiances detected by the detectors 140 will have an impact on the manipulator that is associated with the respective heating light beam, as it has been explained above in section III. This, in turn, will usually require an adjustment of the irradiance of the respective heating light beam in accordance with that computational model.

If only an (unknown) fraction of the heating light is coupled into the optical fibers 142 and eventually impinges on the photodiodes 146, the electrical signals produced by the photodiodes 146 indicate, strictly speaking, not the irradiance of the heating light beams when leaving the refractive optical element 44, but only change of this irradiance. However, this suffices to monitor the proper function of the LEDs 62 and/or to perform their closed loop control.

Figure 22:
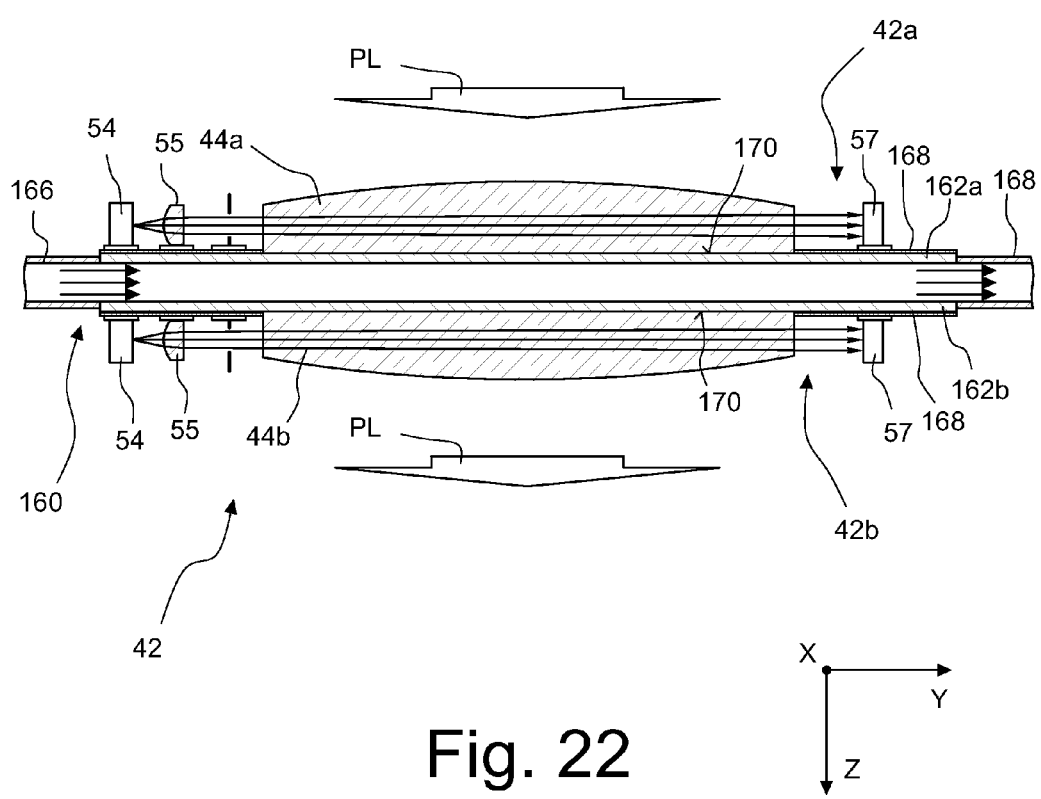
FIG. 22 is a schematic cross section in an YZ plane through a correction device according to still another embodiment in which two refractive optical elements are separated by a cooling gas channel.

FIG. 22 is a schematic cross section in an XY plane through a correction device 42 according to still another embodiment. This embodiment differs from the embodiment shown in FIGS. 3 and 4 mainly in that the correction device 42 comprises a cooling system 160 which helps to establish a neutral heat balance. To this end the cooling system 160 comprises two planar glass plates 162a, 162b that are arranged in parallel and defined in between a wide channel 164. At opposite sides of the channel 164 a gas inlet 166 and a gas outlet 168 are arranged.

Each plate 162a, 162b supports on its surface 170 opposite the channel 164 a separately controlled correction device 42a and 42b, respectively, so that the correction device 42 is in fact a combination of the two individual correction devices 42a, 42b. Here it is assumed that each correction device 42a, 42b is basically designed as the devices shown in FIGS. 3 and 4, but it is to be understood that other designs of the correction device, in particular those designs that are explicitly described in this section, may be used as well. The refractive optical elements 44a, 44b of the correction devices 42a, 42b, respectively, are in this embodiment formed by plano-convex lenses each having a flat surface that is direct contact with the surface 170 of the plate 162a, 162b. This ensures a good heat transfer from the refractive optical elements 44a, 44b to the plates 162a, 162b.

If a gas which has been cooled in a cooling device (not shown) enters the channel 164 via the gas inlet 166 as a constant gas flow, it cools the plates 162*a*, 162*b*. The temperature of the gas may be 1 K, 5 K or even 10 K lower than the overall temperature of the projection objective 20 (usually 22° C.). The plates 162*a*, 162*b*, in turn, cool the refractive optical elements 44*a*, 44*b*. This makes it possible to maintain a neutral heat balance in the correction devices 42*a*, 42*b*. This is important because otherwise undesired thermally induced deformations, which may, for example, result in retarded actuator responses, and damages of gluing connections or lens coatings may occur. Furthermore, only active cooling makes it possible to quickly and/or move frequently change the temperature distribution inside the refractive optical elements 44*a*, 44*b*, because it is not necessary to wait until the heat produced by the absorption of the heating light has dissipated by heat conduction, radiation or convection.

It should be ensured that the temperature of the plates 162*a*, 162*b* outside the portion where they are in contact with the refractive optical elements 44*a*, 44*b* does not drop down too much. To this end an additional electrical heating wire mesh 172 is applied to the surfaces 170 at these portion. The remaining components of the correction devices 42, 42*b* such as the light source 54, the lenses 55 and the absorbers 57, are placed on top of the heating wire mesh 172. By appropriately controlling the heat dissipated in the heating wire mesh 172, it is possible to keep also these portions of the plates 168, 168*b* at a desired constant temperature irrespective of the temperature of the cooling gas.

Further details with regard to suitable designs of the cooling system 160 may be taken from WO 2009/026970 A1.

VI. Summary of Important Aspects of the Invention

The following sentences summarize some other important aspects of the present invention:

1. A projection objective of a microlithographic projection exposure apparatus, wherein the projection objective (20) is configured to image a mask (16) on a light sensitive surface (22) using projection light, and wherein the projection objective (20) comprises a wavefront correction device (42) comprising
   a) a refractive optical element (44) that has two opposite optical surfaces (46, 48), through which projection light passes when the mask (16) is imaged on the light sensitive surface (22), and a circumferential rim surface (50) extending between the two optical surfaces (46, 48),
   b) a light source (101, 102) which is configured to emit heating light such that it impinges on the rim surface, wherein a volume confined by the refractive optical element (44) and the light source (101, 102) is filled by an optical medium (104) that is a liquid, a solid or a mixture of a liquid and a solid.

2. The projection objective of sentence 1, wherein an refractive index ratio of the optical medium (104) and the refractive optical element (44) is at 22° C. between 0.80 and 1.1.

3. A projection objective of a microlithographic projection exposure apparatus, wherein the projection objective (20) is configured to image a mask (16) on a light sensitive surface (22) using projection light, and wherein the projection objective (20) comprises a wavefront correction device (42) comprising
   a) a refractive optical element (44) that has two opposite optical surfaces (46, 48), through which projection light passes when the mask (16) is imaged on the light sensitive surface (22), and a circumferential rim surface (50) extending between the two optical surfaces (46, 48),
   b) a light source which is configured to emit heating light such that it impinges on the rim surface, wherein a portion of the rim surface (50), at which the heating light impinges, is formed as a Fresnel lens (124) having a refractive power at least along one direction.

4. A projection objective of a microlithographic projection exposure apparatus, wherein the projection objective (20) is configured to image a mask (16) on a light sensitive surface (22) using projection light, and wherein the projection objective (20) comprises a wavefront correction device (42) comprising
   a) a refractive optical element (44) that has two opposite optical surfaces (46, 48), through which projection light passes when the mask (16) is imaged on the light sensitive surface (22), and a circumferential rim surface (50) extending between the two optical surfaces (46, 48),
   b) a light source which is configured to emit heating light, wherein the refractive optical element has a bore (120, 122), a hole or a recess in which the light source is arranged such that the heating light enters the refractive optical element perpendicularly.

5. The projection objective of sentence 4, wherein the light source (101, 102) is configured to emit heating light beams over an angular range of at least 40°.

6. A projection objective of a microlithographic projection exposure apparatus, wherein the projection objective (20) is configured to image a mask (16) on a light sensitive surface (22) using projection light, and wherein the projection objective (20) comprises a wavefront correction device (42) comprising
   a) a refractive optical element (44) that has two opposite optical surfaces (46, 48), through which projection light passes when the mask (16) is imaged on the light sensitive surface (22), and a circumferential rim surface (50) extending between the two optical surfaces (46, 48),
   b) a light source which is configured to emit heating light, and
   c) a spatial light modulator, wherein the spatial light modulator (74; 80; 88) is configured to direct the heating light produced by the light source towards different portions of the rim surface.

7. The projection objective of sentence 6, wherein the spatial light modulator comprises a reflective surface (86) and a driver (92) which is configured to change the spatial orientation of the reflective surface.

8. A projection objective of a microlithographic projection exposure apparatus, wherein the projection objective (20) is configured to image a mask (16) on a light sensitive surface (22) using projection light, and wherein the projection objective (20) comprises a wavefront correction device (42) comprising
   a) a refractive optical element (44) that has two opposite optical surfaces (46, 48), through which projection light passes when the mask (16) is imaged on the light sensitive surface (22), and a circumferential rim surface (50) extending between the two optical surfaces (46, 48),
   b) a light source (54) which is configured to emit heating light (HLB1, HLB2, HLB3),
   c) an optical system (OS1, OS2) that directs the heating light towards a portion of the rim surface (50), and
   d) a reflective surface (66) which reflects at least 70% of heating light, which has traversed the refractive optical element (44), so that it traverses the reflective optical element (44) again.

9. The projection objective of sentence 8, wherein the reflective surface (66) is arranged outside the refractive optical element.

The invention claimed is:

1. A projection objective configured to use projection light to image an object onto a light sensitive surface, the projection objective comprising:
   a wavefront correction device, comprising:
      a refractive optical element comprising a first optical surface, a second optical surface opposite the first optical surface, and a circumferential rim surface between the first and second optical surfaces, wherein the first and second optical surfaces are configured so that, during use of the projection objective to image the object onto the light sensitive surface, projection light passes through the first and second optical surfaces;
      a first optical system configured to direct a first heating light to a first portion of the circumferential rim surface so that at least a portion of the first heating light enters the refractive optical element; and
      a second optical system configured to direct a second heating light to a second portion of the circumferential rim surface so that at least a portion of the second heating light enters the refractive optical element,
   wherein:
      the second portion of the circumferential rim surface is different from the first portion of the circumferential rim surface;
      during use of the first and second optical systems, a temperature distribution caused by a partial absorption of the first heating light and the second heating light changes a refractive index distribution inside the refractive optical element;
      the first optical system comprises a focusing optical element configured to focus the first heating light in a focal area so that, during use of the first optical system, heating light emerging from the focal area impinges on the first portion of the rim surface;
      the first heating light is strongly absorbed in the refractive optical element than the projection light;
      the second heating light is strongly absorbed in the refractive optical element than the projection light;
      the first heating light has a center wavelength between 2.0 µm and 2.3 µm or between 2.6 µm and 2.8 µm;
      the second heating light has a center wavelength between 2.0 µm and 2.3 µm or between 2.6 µm and 2.8 µm;
      the projection light has a center wavelength between 150 nm and 500 nm; and
      the projection objective is a microlithography projection objective.

2. The projection objective of claim 1, wherein, during use of the first and second optical systems, the change in the refractive index distribution inside the refractive optical element at least partially corrects a wavefront error of the projection objective.

3. The projection objective of claim 1, wherein the first optical system comprises a blind having an aperture in which the focal area is positioned.

4. The projection objective of claim 1, wherein, after the first heating light has entered the refractive optical element, the first heating light propagates through the refractive optical element as collimated light.

5. The projection objective of claim 1, wherein the circumferential rim surface is cylindrical or conical.

6. The projection objective of claim 1, wherein the first portion of the circumferential rim surface is curved in a plane intersecting the first portion and containing an optical axis of the projection objective at a position where the refractive optical element is arranged.

7. The projection objective of claim 1, wherein the wavefront correction device further comprises:
   a light source configured to emit heating light; and
   a beam splitter configured to split the heating light emitted by the light source into the first heating light and the second heating light.

8. The projection objective of claim 1, wherein the first optical system comprises a single first light source configured to produce the first heating light, and the second optical system comprises a single second light source configured to produce the second heating light.

9. The projection objective of claim 7, wherein the first optical system comprises a spatial light modulator configured to change the intensity of the first heating light in a spatially resolved manner to produce a plurality of first heating light beams with individually changeable intensities via the spatial light modulator.

10. The projection objective of claim 9, wherein the spatial light modulator comprises an array of beam deviating elements, and each beam deviating element is configured to deflect impinging first heating light by a deflection angle that is variable in response to a control signal.

11. The projection objective of claim 9, wherein the spatial light modulator comprises a variable blind having a plurality of apertures whose size and/or transmissivity is changeable individually in response to a control signal.

12. The projection objective of claim 1, wherein the first optical system comprises a plurality of first light sources, and each first light source is configured to produce a first heating light beam.

13. The projection objective of claim 12, wherein at least one first light source comprises an LED having an intensity that can be varied individually.

14. The projection objective of claim 12, wherein at least one first light source comprises a laser diode, and the first optical system comprises a light modulator configured to individually change the intensity of the first heating light beam.

15. The projection objective of claim 1, wherein the first optical system comprises a reflective surface configured to reflect at least 70% of heating light which has traversed the refractive optical element so that the heating light traverses the reflective optical element again.

16. The projection objective of claim 15, wherein the reflective surface is arranged so that a direction of reflected light differs from the direction of impinging light.

17. The projection objective of claim 16, wherein the direction of reflected light differs from the direction of impinging light by an angle between 0.05° and 5°.

18. The projection objective of claim 15, wherein the reflective surface comprises a multi-layer coating supported by the circumferential rim surface.

19. The projection objective of claim 15, wherein the reflective surface comprises a multi-layer coating supported by a substrate arranged a distance from the refractive optical element.

20. The projection objective of claim 1, wherein the first optical system comprises a beam deviating element configured to deflect the first heating light so that the focusing optical element is arranged completely above or completely below the circumferential rim surface.

21. The projection objective of claim 1, wherein, in a plane perpendicular to an optical axis of the projection objective at a position where the refractive optical element is arranged, the focusing element and the refractive optical element have the optical effect of positive lenses.

22. The projection objective of claim 21, wherein the volume of the focusing element is at least 100 times smaller than the volume of the refractive optical element.

23. The projection objective of claim 1, wherein:
the first heating light propagates in a first plane;
the second heating light propagates in a second plane; and
the first plane is identical to the second plane.

24. The projection objective of claim 1, wherein:
the first heating light propagates in a first plane;
the second heating light propagates in a second plane; and
the first plane is parallel to the second plane.

25. The projection objective of claim 1, wherein the focal area is a focal point or a focal line.

26. The projection objective of claim 1, wherein the focusing element has a focusing power only along one direction.

27. The projection objective of claim 26, wherein the focusing element comprises a cylindrical lens.

28. The projection objective of claim 1, wherein the refractive optical element comprises an optical glass comprising between 50 ppm and 500 ppm OH molecules.

29. The projection objective of claim 28, wherein the optical glass comprises between 90 ppm and 150 ppm OH molecules.

30. The projection objective of claim 28, wherein the first and second heating lights have the same center wavelength.

31. The projection objective of claim 30, wherein:
the first optical system comprises first light detectors configured to measure irradiance variations of the first heating light beams after they have left the refractive optical element; and
the second optical system comprises second light detectors configured to measure irradiance variations of the second heating light beams after they have left the refractive optical element.

32. The projection objective of claim 31, further comprising a control unit configured to control the first and second optical systems depending on irradiance variations measured by the first and second detectors.

33. The projection objective of claim 1, wherein the first optical system further comprises an optical fiber configured to guide the first heating light from a first light source, which is arranged outside the projection objective, to the focusing optical element.

34. The projection objective of claim 1, wherein the wavefront correction device further comprises a cooling system configured to actively cool the refractive optical element.

* * * * *